United States Patent
Molhave

(10) Patent No.: US 7,586,105 B2
(45) Date of Patent: Sep. 8, 2009

(54) MICROFABRICATED CANTILEVER CHIP

(75) Inventor: Kristian Molhave, Gentofte (DK)

(73) Assignee: Nanofactory Instruments AB, Gothenburg (SE)

(*) Notice: Subject to any disclaimer, the term of this patent is extended or adjusted under 35 U.S.C. 154(b) by 147 days.

(21) Appl. No.: 11/737,295

(22) Filed: Apr. 19, 2007

(65) Prior Publication Data

US 2007/0278420 A1   Dec. 6, 2007

Related U.S. Application Data

(63) Continuation of application No. PCT/SE2005/001631, filed on Oct. 28, 2005.

(51) Int. Cl.
 *H01J 37/20* (2006.01)
 *G01N 3/02* (2006.01)
 *H01L 41/09* (2006.01)

(52) U.S. Cl. ............... 250/440.11; 250/442.11; 250/311; 73/855; 73/856; 73/860; 73/864.91; 324/555

(58) Field of Classification Search ........... 250/440.11, 250/442.11, 311; 73/855, 856, 860, 864.91; 324/555

See application file for complete search history.

(56) References Cited

U.S. PATENT DOCUMENTS

| 4,954,712 | A | | 9/1990 | Wilcox |
| 5,149,673 | A | * | 9/1992 | MacDonald et al. ......... 438/611 |
| 5,729,026 | A | | 3/1998 | Mamin et al. |
| 6,242,737 | B1 | * | 6/2001 | Ohnishi et al. ............. 250/306 |
| 6,587,612 | B1 | * | 7/2003 | Mitchell et al. ............. 385/18 |
| 6,590,212 | B1 | | 7/2003 | Joseph et al. |
| 7,375,325 | B2 | * | 5/2008 | Burkhardt et al. ............ 250/307 |

FOREIGN PATENT DOCUMENTS

WO    02084210    10/2002

* cited by examiner

*Primary Examiner*—Jack I Berman
(74) *Attorney, Agent, or Firm*—Gauthier & Connors LLP

(57) ABSTRACT

The present invention relates to a device and system from doing mechanical and electrical measurements and manipulation on nano or micro sized objects using a sample holder adapted to fit in situ of a transmission electron microscope. The sample holder comprise at least two arms each with at least one connector whereby the sample (206) may be mounted between the two connectors forming a bridge closing a gap between the two arms of the sample holder. The sample holder is arranged to provide mechanical forces to a sample mounted on the sample holder and measuring and/or applying electrical signals from the sample while at the same imaging using the transmission electron microscope. Each arm of the sample holder may comprise three substantially parallel beams for electro-thermal actuation.

20 Claims, 15 Drawing Sheets

MICROFABRICATED CANTILEVER CHIP

PRIORITY INFORMATION

The present application is a continuation of PCT Application Serial No. PCT/SE2005/001631, filed on Oct. 28, 2005 that claims priority to Denmark Application No. DK 200401661 filed on Oct. 28, 2004. Both applications are incorporated herein by reference in their entireties.

TECHNICAL FIELD

The present invention relates to a micro fabricated cantilever chip and in particular to a micro and nano gripping device for use in transmission electron microscopes.

BACKGROUND OF THE INVENTION

Research and development of and on micro and nano sized objects and systems have received considerable interest the last few decades and have accelerated the last decade during the advent of nanotechnology. Doing work on objects of this scale set demands on the instrumentation and techniques used in order to be able to manipulate, assemble, measure and do testing on these objects. Several different measuring devices have been developed in order to do some of these types of activities, often instrumentation is designed for specific purposes, for instance the atomic force microscope is used for obtaining images of force interactions between a surface and a probe of surfaces down to atomic resolution at it's best, scanning electron microscopy and transmission electron microscopy are both used for obtaining images using electron beams, tensile instrumentation are used for measuring mechanical properties of material and so on. Apart from a few exceptions these types of activities are not combined into one instrumentation, for instance Nanofactory Instruments have add on equipment for doing scanning tunneling microscopy (STM), AFM or similar techniques in situ of a TEM.

There is a large need of being able to measure different types of physical properties while at the same time imaging the objects in order to better understand processes involved, further it is of interest to use the same techniques eventually in production line systems and processes. The general solution is therefore to measure the different properties of interest using different types of stand alone equipment on different locations in a laboratory for instance. This puts a burden on the user since there is a large risk that the sample under inspection is altered during passage from one instrument to another. It can even be destroyed or moved in position rendering measurements impossible.

It is therefore an object of the present invention to provide a device and a system for nano or micro sized objects which provide access to measurement and manipulation in situ of a transmission electron microscope.

SUMMARY OF THE INVENTION

The present invention is provided in several different aspect, where in a first aspect, a sample holder for nano or micro sized objects is provided, said sample holder being arranged to be positioned in situ of a transmission electron microscope, characterized in that said sample holder comprise:
  a substrate structure with
  at least two arms protruding out from said substrate structure and positioned substantially in parallel with each other forming a gap between them;
  a connector arranged to receive part of a sample on each arm,
  wherein said at least two arms are arranged to receive a sample forming a bridge between said two arms;

The connector may be an electrical connector enabling electrical testing on said sample and/or a mechanical connector enabling mechanical testing on said sample.

The substrate structure may be arranged to be mounted in a transmission electron microscope grid holder. The substrate structure may be adapted to be mounted directly or indirectly to a piezoelectric driven inertial slider device.

Each arm may be formed by three substantially parallel beams with a connection beam at a distal end away from said substrate structure and said beams is made of a resistive material through which an electrical current may pass, wherein said arm will bend depending on applied current. The three beams may be made of a piezo resistive material. The three beams may be electrically connected in a Wheatstone bridge arrangement.

A gripping structure may be located on said connection beam of each arm and located so as to be adjacent to a neighbouring gripping structure, said gripping structure protruding away from said substrate structure in a longitudinal direction of said beams. The gripping structure may be arranged to be part of a tensile force testing.

The gripping structure may be arranged to enter a receiving structure of a sample.

Another aspect of the present invention, a system for doing measurements and/or manipulation on nano or micro sized objects is provided, comprising:
  a sample holder, arranged to be used in situ of a transmission electron microscope, for mounting of said nano or micro sized object, said sample holder comprising a substrate structure with at least two arms protruding out from said substrate structure and said arms positioned substantially in parallel with each other forming a gap between them; each arm comprise an electrical connector onto which said sample is to be mounted, wherein said sample is mounted on two electrical connectors and forming a bridge between said two connectors; and electronics for applying signals to said sample and measuring response effects from said sample The arms may comprise three substantially parallel beams with a connection beam at a distal end away from said substrate structure and said beams is made of a resistive material through which an electrical current may pass, wherein said arm will bend depending on applied current. The three beams are made of a piezo resistive material.

The system may further comprise electronics for measuring and/or controlling forces applied to said beams. The system may further comprise electronics for applying an oscillating signal to at least two beams of each arm and electronics for applying a lock-in analysis on signals obtained from said piezo resistive material.

The system may further comprise a nano or micro positioning device for positioning said sample holder spatially. The system may further comprise electronics for controlling application of control signals to said beams to control a pick-and-place operation of nano or micro sized objects.

Yet another aspect of the present invention, a microfabricated chip for investigating a material sample is provided, said microfabricated chip comprising a substrate holding at least two cantilever structures adapted to perform mechanical and/or electrical measurements on said material sample held by said at least two cantilever structures.

The microfabricated chip may have a geometry of said substrate that is adapted to fit a standard transmission electron microscope grid holder.

The invention may also in part be summarized by the following:

1 The TEM-Chip System

Despite the superior resolution, the very narrow sample space of a TEM has so far limited the possibilities for in-situ TEM nano manipulation in practice. AFM and STM systems are commercially available from companies such as the Swedish company Nanofactory Instruments AB. In this project I have designed microfabricated cantilever electrode chips compatible with both standard TEM probe holders and a custom made in-situ probe holder with electrical connections. In this TEM-chip system, nanostructures can ex-situ be manipulated onto the chips, for then ex- or in-situ to be subjected to electrical or mechanical experiments. The changes taking place in the nanostructure can then be followed by TEM analysis between or during the experiments. Such measurements are not possible with the systems from Nanofactory, where the contact would be lost when removing the probe from the TEM due to vibrations.

The cantilever chips were fabricated by the conductance probe process described below, and made to fit into a standard TEM sample holder (Outer Ø<3 mm). To reduce the risk of loosing a probe in the TEM, they were glued to a 0.5×2 mm slot nickel TEM grid (standard Cu grids were too soft to sustain prolonged use).

The system can be compared to the thin film TEM grids by A. Yu. Kasumov, H. Bouchiat, B. Reulet., O. Stephan, I. I. Khodos, Yu. B. Gorbatov, and C. Colliex. Conductivity and atomic structure of isolated multiwalled carbon nanotubes. Europhysics Letters, 43(1):89-94, 1998. Kasumov uses FIB to make a sub-micron gap in a Si3N4 thin film on a TEM grid with a metal coating reaching the edge of the slit. Nanotubes are dispersed onto the device until contact is achieved, and in this way measurements on individual nanotubes can be made. The TEM-Chips system appears to offer more possibilities in terms of varying the design of the cantilevers, to make for instance multi-point conductance measurements. Batch microfabrication also seems preferable to expensive FIB treatment of individual devices. The present use of optical manipulation equipment for placing nanotubes on the TEM-Chips, make it easier to ensure that the electrical measurements are done on one specific tube than if tubes were just dispersed onto the device.

Kasumov et al. did measurements down to 100 K on their samples. Only one TEM-chip has been tested at cryogenic temperatures and contact was lost at 150 K. Such measurements are often essential to understand the electrical properties of a device and further experiments are planned to improve the reliability of the cryogenic contact in the TEM-Chip device.

Another comparable device is the micro machined grippers made by Gen Hashiguchi, Takushi Goda, Maho Hosogi, Ken Hirano, Noritada Kaji, Yoshinobu Baba, Kuniyuki Kakushima, and Hiroyuki Fujita. Dna manipulation and retrieval from an aqueous solution with micro machined nano tweezers, Analytical Chemistry, 75(17):4347-4350, 2003, which have been used to retrieve DNA from solutions by dielectrophoresis, for then to analyze the DNA in TEM.

The TEM beam is intense and can dissipate up to mW's of power. The silicon based probes can therefore be heated considerably up in the TEM. The cantilevers should be as short as possible to avoid bending during heating due to the different thermal expansion coefficients of the Si02 and metal coating.

For electrical measurements during manipulation or between TEM investigations, either a probe station or wire bonds can be used to contact the chip. To quickly contact the device for reproducible and reliable electrical measurements between TEM analysis a small portable probe station was constructed, where electrical measurements could be made on the TEM-Chips without removing them from the standard TEM probe holders.

FIG. 10: The TEM-chip system. a) Chips were developed to fit directly into a standard TEM probe holder. For easy handling, the chips were glued to a standard Ni-TEM grid (φ 3 mm). b) In some TEM probe holders there is also space to use the larger chips with the standard layout used for the conductance probe process (FIG. 11), when glued to a TEM grid. c) For electrical measurements, I constructed a mobile probe station with two xyz-stages to contact the chips electrically with metal needles. The TEM probe holder could be inserted directly into the probe station without touching the TEM chip.

FIG. 11: The conductance probes. a) by_microfabrication processes], a Si02 cantilever array system is made. b) The cantilevers are underetched by isotropic RIE and metallized by anisotropic metal deposition (usually 10 nm Ti/100 nm Au). The underetch prevents the cantilevers from short-circuiting. Depending on the RIE conditions, the cantilever sidewalls will be slightly inclined and to some extent become metallized as well. c) SEM image of such a probe contacting InP nanowires in the in-situ SEM setup. The darker of the cantilevers is positively biased with 20 V.

1.0.1 The In-Situ TEM Probe Holder

Although no direct nano manipulation system has been made for the TEM in this project, the microfabricated grippers could in principle be used to stress or bend a nanowire placed across the gripper gap. To do such an experiment in-situ, electrical connections are needed to the chip in the TEM. I constructed a probe holder were in-situ electrical contact to the chips can be made by wedge bonding wires between the chip and holder. It has been tested and approved for use in the TEM. It is planned to do in-situ shell-burn experiments on carbon nanotubes with this probe, to follow the process in detail when done in vacuum. In-situ electrical contact to the probes also open up new experimental possibilities, such as actuating grippers to deform structures bridging the gripper gap and follow the changes in their structure and electrical properties.

1.0.2 The Current TEM Chip Fabrication Process

The present TEM chips were fabricated by the process we are currently using in the lab to process micro cantilever probes. Any cantilever probe should fit into a TEM provided the outer perimeter fits into standard probe holders (Ø 3 mm)—larger probes would require dedicated holders to be made which would considerably increase the cost of the system.

The conductance probes. By microfabrication processes, a Si02 cantilever array system is made. The cantilevers are underetched by isotropic RIE and metallized by anisotropic metal deposition (usually 10 nm Ti/100 nm Au). The underetch prevents the cantilevers from short-circuiting. Depending on the RIE conditions, the cantilever sidewalls will be slightly inclined and to some extent become metallized as well.

Probes for measuring surface conductivity on the micrometer scale by microfabricated cantilevers had prior to this project been developed by Torben M. Hansen. Tools for Nanoscale Conductivity Measurements. PhD thesis; MIC—Department of Micro and Nanotechnology, Technical University of Denmark, 2003. The conductance probes are now commercially available from the company Capres A/S (www.capres.com). The process for making the conductance probes is briefly described in P. Boggild, T. M. Hansen, C. Tanasa, and F. Grey. Fabrication and actuation of customized nanotweezers with a 25 nm gap. Nanotechnology, 12(3):331-335, 2001, while the above mentioned reference Torben provides a detailed discussion. The most essential step in the fabrication process to consider for the present work, is the anisotropic gold coating of the under-etched cantilever electrodes. The gold coating on the sidewalls of the cantilevers can vary in thickness and uniformity from device to device. The total resistance including leads and contact resistance of one cantilever electrode to a gold surface is usually about 90Ω.

2 Feasibility Study of the TEM Chip System

3 TEM Investigation of Nanotube Shell Burn

The limited resolution and high noise of SEM experiments have led to the development of the TEM-Chip system to achieve high resolution images of the nanotube structure during the shell burn experiments. If the TEM-Chip investigation of the shell burn process is feasible, more detailed studies should be initiated to thoroughly characterize the behavior of different types of MWNT, since proper modeling of these complex nanosystems seem to require detailed knowledge of the dependence on the internal structure of the individual tube.

3.1 Setup and Probe Preparation

The setup for the TEM-Chips was described above. Individual C-MWNT bridges between microcantilevers were made by manipulation with an etched tungsten tip in an optical manipulation setup.

The bridge resistance was often in the 100 kΩ range when the nanotube was initially placed on the cantilevers. Temporary condensation of water onto the chip surface usually resulted in bridge resistances below 50 kΩ for about every other tested nanotube. The capillary forces during drying of the chip can apparently pull the nanotube into close contact with the cantilever surface. The temporary condensation can be achieved simply by breathing on the chip. Once a bridge has been made, the device is extremely sensitive to electrostatic discharges. Outmost care must be taken to ensure proper grounding during handling of the device.

The TEM investigation was done in a Philips EM 430 operating at 100 keV. The TEM analysis was made at low beam currents, with short exposure times on the bridging MWNT, and liquid nitrogen cooling of the TEM cold finger to avoid damaging it. No major influence was observed on the electrical properties of the TEM-chip devices by the TEM investigation.

The experiments were made using an improved computer programs to control the IV acquisition. In the initial program used for the scanning conductance probe measurements, the acquisition did not provide information about the possible time dependence of the conductance. A new program was made that stopped the voltage sweep (IV curve) during a shell burn experiment when predefined voltages was reached or current saturation occurred (dI/dV=0). When the sweep was stopped, the current was recorded as function of time (Jt-curve) until the user chose to continue the voltage sweep or to start from zero bias voltage in a new sweep,

3.2 Experimental Results and Discussion

This section will first describe a typical TEM image sequence for shell burn experiments performed in air to provide an overview of the general effects that have been observed. Then an overview is given of the electrical measurements that have been done, in order to find the general characteristics of the C-MWNT sample. Finally the acquired IV and It curves are discussed, and the shell burn experiments performed in air are compared to similar experiments performed in a nitrogen flow.

3.2.1 Shell Burn Performed in Air

In a typical sequence of the progressive burning of a nanotube in air, where shell burn experiments have been performed between each TEM image, the nanotube clearly becomes thinner in the middle part of the bridge and also severely damaged in the vicinity of a large catalytic particle. It is assumed that all observed particles in the C-MWNT are catalytic Fe particles, although this has not been verified by EDX or similar measurements. Another catalytic particle is visible within the interior cavity of the nanotube in the upper part of the image. This particle does not cause damage to the nanotube and only moves slightly in the images. The catalytic particles in the nanotube interior generally move and deform very much as described in the work by Hansoo Kim, Michael J Kaufman, and Wolfgang M Sigmund. Phase transition of iron inside carbon nanotubes under electron irradiation. Journal of Materials Research, 19(6):1835-1839, 2004.

The length of the cantilever gap Lgap may span the range 0.7-8 μm. However, the length between contact points of the nanotube located on top of the cantilevers, Ltube could be larger than the gap length. It does however seem that the nanotubes probably make contact close to the edge of the gap, since the measured resistance is reasonably linear with gap length for the investigated nanotubes. The measured resistance as function of length seems to be linear through origo, indicating a negligible contact resistance. Fitting gives a contact resistance of 0.5 kΩ which is less than 10% of the measured resistances and the cantilevers alone contribute with about 90Ω to that value. The resistance multiplied by area also shows a reasonably linear dependence on gap length (~3.5 k Ω/μm). The observations indicate that the nanotubes are diffusive conductors with resistance R=ρL/A and the measured resistivities are scattered in the range 20-100 times the in-plane resistivity of graphite (Pgraphite=5*10-5 Qcm), which is comparable to the results by Hongjie Dai, Eric W. Wong, and Charles M. Liebert. Probing electrical transport in nanomaterials: conductivity of individual carbon nanotubes. Science, 272(5261):523-5267 1996.

Most nanotubes burned somewhere in the visible region of the gap, indicating that heating was mainly taking place in the suspended part of the nanotube rather than at the contact point. This is in agreement with the expectation of low contact resistance and diffusive transport. Ballistic conductance would imply that most heat was dissipated at the contacts and little if any dissipation would be in the nanotube L. Shi, P. Kim, S. Plyasunov, A. Bachtold. P. L. McEuen, and A. Majumdar. Scanning thermal microscopy study of dissipation in current-carrying carbon nanotubes. American Society of Mechanical Engineers, Heat Transfer Division, (Publication) HTD, 369(7):247-252, 2001.

The nanotubes burned at a bias voltage about 2 V, almost independent of gap length. Since it is independent of length, it is not likely to be related to an electrical breakdown phenomena in the nanotubes which would normally be determined by the electrical field in the nanotube (E=V/Lgap) reaching some limiting value. The constant saturation value taken alone could be taken as indication of a breakdown phenomena at the contacts at 2 V, but this is in contradiction with all the above observations indicating Ohmic behavior of the nanotube. Although the 2V limit seems to be very constant, it could be a fortuitous coincidence of nanotube length, diameter and conductance, making the nanotubes burn at this voltage, but this is unlikely given the wide spread in the tube dimensions. The peak current density reaches 106-107 A/cm2 for all nanotubes comparable to the current density observed by S.-B. Lee, K. B. K. Teo, M. Chhowalla, D. G. Hasko, G. A. J. Amaratunga, W. I. Milne, and H. Ahmed. Study of multi-walled carbon nanotube structures fabricated by pmma suspended dispersion. Microelectronic Engineering, 61-62:475-483, 2002. Measurements on the same nanotube with different gap lengths should be done to study if the saturation voltage is indeed independent of length.

The peak power is quite different for the studied C-MWNT, but seems to be limited to about 1 mW. The wide scattering in peak power is in sharp contrast to the relatively constant peak voltage.

FIG. 12: A series of TEM images of a C-MWNT, bridging two cantilevers on a TEM-Chip, and showing the progressive destruction due to shell burn experiments in air. The 3 corresponding IV and It curves recorded between the TEM images are shown in FIG. 14. a) Overview images. The dotted white line indicates the motion of a catalytic particle within the nanotube cavity. The nanotube, breakdown primarily takes place in the vicinity of a catalytic particle incorporated in the shell structure. The middle part of the tube is also considerably thinned down during the shell burn experiment. Four close-ups TEM images are shown below, each from the above image in (a): b) The largest catalytic particle with a thin carbon coating. c) The destroyed shell structure just above the catalytic particle. d) The large catalytic particle. e) A new layered carbon shell structure formed around the catalytic particle during TEM FIG. 13: Overview of the electrical properties of those devices that achieved good contact to the MWCNT (R<50 kn). a) The distribution of the tube diameter T appears homogeneous with a relatively constant spread in the area of the tubes, independent of the gap length (0.7-9 [4 m). b) Measured zero bias resistance versus length show that the tubes are diffusive conductors on the micron scale and have a (almost negligible) contact resistance of the order 0.5 kΩ. The inset shows how the gap length not necessarily reflects the true length of the nanotube between contact points. c) At high bias voltages the current saturation occurs at a relatively constant voltage of about 2 V, for almost all tubes, independent of length. d) The maximum power dissipated in the bridges does not exceed 1 mW and is about 0.5 mW for most samples.

3.2.2 Discussion of the IV and It Curves

The following discussion is based on the data acquired for the nanotube as described above, which is representative for the observed behavior of the investigated nanotube devices. Different models are briefly discussed that could explain the IV characteristics and a simple model is found that describe the IV data well.

Sequential IV curves can be measured on the nanotube discussed above. The voltage sweep was started at 0V, and initially every 0.2 V the sweep was stopped temporarily to observe the time dependence of the current at fixed bias. As the saturation point was approached, more stops were made in the sweep. At low bias voltages up to a bias voltage about 1.5V, the current decay rate is negligible (of the order nA/s). Above 1.5 V, the decay rate increases and appears linear in time for the acquired time series for bias voltages up to about 1.7 V.

Above 1.7V the current decay with time can be fitted well with an exponential decay towards a steady state value. If only the initial 10 seconds of the exponential decay with reasonably linear behavior is considered, the decay rate of the current increases linearly with bias voltage as 16 μA/s per volt bias. The logarithm to the measured decay rates are not obviously linear functions of power and it is therefore difficult to relate the decay rate to an estimated temperature and corresponding Arrhenius like dependence of oxidation rate.

The time factor is an increasingly important factor for the shape of the IV curve at high bias voltages.

The IV sweep is nonlinear, even at low bias voltages<1.5V, with conductivity increasing with voltage. The electrical and thermal conductivity generally depends on temperature. The joule heating of the bridge by the dissipated power can influence the measurements depending on the temperature coefficient of resistance and thermal conductivity of the nanotube (and thermal and electrical contact resistance, which will be neglected below). A simple model can estimate the effect of the self-heating of the nanotube due to the dissipated power. To first order, the linear temperature coefficient $\alpha$ of resistance gives $$R = R_o(1 + \alpha(T - T_o)) \qquad (1)$$

Using $\Delta T = T - T_o$ one can estimate the effect of the dissipated power in the nanotube resistance if the material constants are known. For carbon fibers, $\alpha$ has been measured to lie in the range [−0.13; 0.02] %/K, see S. Blazewicz. B. Patalita, and Ph. Touzain. Study of piezoresistance effect in carbon fibers. Carbon, 35(10-11):1613-1618, 1997. Given the diffusive transport and defect density of the C-MWNT in this work, these values are probably reasonable estimates for the present sample. Measurements by P. Vincent, S. T. Purcell, C. Journet, and V. T. Binh. Modelization of resistive heating of carbon nanotubes during field emission. Physical Review B (Condensed Matter and Materials Physics), 66(7): 075406/1-5, 2002 give resistance as function of temperature as $R[\Omega] = 2*106 - 820\Delta T$ and hence a value of $\alpha = -0.041\%1$ K, which falls within the values found for carbon fibers, although the measured resistance was rather high compared to our devices. We did attempt to do one cryogenic measurements on a NWNT on a TEM-Chip. The measured temperature coefficient was in the range [−0.2; −0.02] %/K. Based on these results the nanotubes studied here seem to have negative temperature coefficient of resistance within the expected range from $\alpha$. The discussion in many published works discusses the temperature dependence of resistance. However, F. Zhou, L. Lu, D. L. Zhang, Z. W. Pan, and S. S. Xie. Linear conductance of multiwalled carbon nanotubes at high temperatures. Solid State Communications, 129(6):407-410, 2004 discussed the temperature dependence of conductance for their C-MWNT sample, which they found to be highly linear in the wide range of temperature 50-800 K. For sufficiently small $\alpha \Delta T \ll 1$ the two following equations are approximately identical $$G = G_{0V}(1 - \alpha \Delta T) = G_{0V}\left(1 - \alpha \frac{L}{8_K A} P\right) \qquad (2)$$

$$R = R_{0V}(1 - \alpha \Delta T) = R_{0V}\left(1 - \alpha \frac{L}{8_K A} P\right) \qquad (3)$$

From the data presented by Zhou et al. a seems to have a value of about 0.1%, and a $\Delta T$ covers a range of about 0.3. In this case the two above equations will no longer be equal at all temperatures and the results by Zhou et al. do not look linear of plotted as R vs T. To get an indication of which equation (Eq 2 or 3) that describes the present nanotube sample best, we may plot R=U/I and G=I/U vs. dissipated power P=UI for the voltage sweeps. All R and G vs. P are surprisingly linear, especially when considering that the considerable tube damage from one voltage sweep curve to the next. The linearity of both R and G vs. P indicates that $\alpha\Delta T$ is small in the present case.

The curves in R vs P are slightly curved for all three shell burn sweeps mentioned above, while the G vs P curves appear more linear for all three shell burn curves. For the G vs P curves at high powers, the inclination is slightly lower, but this can be explained by the shell burning taking place while the sweep is being done at high bias. The sequential shell burn curves have almost the same inclination for each individual sweep in the C vs P curves, and this is also the case for the results made by scanning four point probes in air by Søren Dohn. This makes it tempting to suggest Eq. 2 as a phenomenological model for the MWNT conduction in the present sample. The apparent applicability of Eq. 2 is beyond expectations, since the nanotube behaves linearly even after several shell burns have been performed on it and has been almost broken in two pieces.

The thermal conductivity of the nanotube cannot be assumed to be constant based the measurements reported on literature, see P. Kim, L. Shi. A. Nlajumdar, and P. L. McEuen. Thermal transport measurements of individual multiwalled nanotubes. Physical Review Letters, 87(21):2155021-2155024, 2001. It would be interesting to verify if the better fit of Eq. 2 than Eq. 3 also holds for tubes heated externally rather than by dissipated power. Measuring IV curves of the C-MWNT at various temperatures should provide such information.

FIG. 14: Electrical measurements on C-MWNT in air with both bias voltage scan and observation of the current as function of time for temporarily fixed bias voltages. a) IV curves showing sequential reduction of conductance after reaching the current saturation point. The inset shows the tube image sequence from FIG. 3. The vertical parts of the curve appears when bias has been kept fixed temporarily. b) The current as function of time during periods with temporarily fixed bias voltage. The current decreases faster as the current saturation point is reached and crossed. c) Device resistance R in units of $R_o = G_0^{-1}$ versus dissipated power P=U*I d) Conductance G/Go versus P. For fixed voltage during the time sequences, the G-P curve follows lines $G=P/U^2$. The dependence is for all voltage sweeps of the type G=aP+b (Eq. 2). The R vs P graph, which does not follow the linear prediction by Eq. 3 as well as the G vs P graph follows Eq. 2.

3.2.3 Shell Burn Performed in Nitrogen

In the SEM experiments, the nanotubes were observed to fail in a single step. To study the effect of shell burn in an inert environment, shell burn experiments were done with a flow of nitrogen directed onto the nanotube. The nitrogen flow was directed onto the TEM-Chip from a handheld plastic tube. In these experiments the possibility of a spurious draft of air cannot be excluded, and the results can only be taken as an indication of what would probably happen if the experiments were performed in a, truly inert environment.

This is one of the few cases where a step wise reduction in current was seen. This could be interpreted as the individual "shells" in the nanotube burning off one by one. The step size is not as constant as those reported by P. C. Collins, M Hersam, M. Arnold, R. Martel, and Ph. Avouris. Current saturation and electrical breakdown in multiwalled carbon nanotubes. Physical Review Letters, 86(14):3128-3131, 2001. The irregular step size in the present experiment could partly be due to the nanotube being under stress, since its a suspended nanotube not supported by a substrate as those used by Collins et al. The G vs P plot for the nitrogen experiment follows the Eq. 2 remarkably well for both shell burns.

FIG. 15: Shell-burn curves performed on a C-MWNT in nitrogen. a) IV curves. The voltage was kept fixed when saturation was reached and the current was followed as function of time. The areas with dark rings encircle the regions with most damage to the tube structure. b) The current vs time for the curves in (a). This is one of the few shell burn curves that display a resemblance to the results by Collins et al with stepwise reduction of current. c) G vs P graph. The sweep follows Eq. 2 remarkably well for both sweeps.

3.3 Summary

Pristine individual C-MWNT were manipulated by etched tungsten tips to make bridges between microcantilevers on TEM-Chips for TEM investigation and electrical measurements. The contact resistance was reduced by making water condense temporarily onto the sample. The nanotube bridges had resistances increasing linearly with the length of the cantilever gap, and seemed to have a negligible contact resistance. The nanotubes were found to be diffusive conductors with a resistivity 20-50 times that of the graphite in-plane resistivity. Shell burn experiments were performed by sweeping the applied bias voltage and recording the current through the nanotube. The current increased until a saturation point would be reached at about 2 V. At the saturation point the bias voltage was kept fixed and the current was observed to decrease over time. The current decrease indicates a slow burning of the heated nanotube in air. Before and after a shell burn experiment, the nanotube was imaged in TEM. The saturation voltage of 2 V was inexplicably constant compared to the dissipated powers and estimated temperatures when shell burning was taking place. Time was found to be an important factor for the shape of the IV curve when current saturation was approached.

The simplest first order equation for the temperature dependence of resistance and conductance was compared to the results. The tubes bad reasonably linear dependence of both resistance (R) and conductance (G) as function of dissipated power (P). For the described devices, plots of G vs P appeared more linear than that of R vs P. Further studies of the temperature dependence of conductance is needed to link the observations with a specific model for MWNT conduction such as those described in the beginning of the chapter.

4 Outlook

The reliability of the TEM chip system has been demonstrated, and with this the ability to use the wide variety of microfabricated probes, such as grippers, opens up unprecedented opportunities. If a nanowire is suspended between the actuators of a gripper, it should in principle be possible to study both the electrical, and mechanical properties. The experiment would resemble that of piezoresistive measurements on the soldered carbon nanotube. But instead of using an tungsten tip to actuate the cantilevers, the gripper could be used (if sufficient gripping force is available). This would make it possible to perform the experiment under a wide range of conditions such a cryogenic, or various environments, and TEM analysis can be done between experiments. Its worth noting that important material constants such as the thermal conductivity can be measured by a lock-in four point conductance setup by the so-called $3\omega$-method, see W. Yi, L. Lu, Zhang Dian-lin, Z. W. Pan, and S. S. Xie. Linear specific heat of carbon nanotubes. Physical Review B (Condensed Matter), 59(14):R9015-18, 1999.

The invention may also in part be summarized in the following:

Electro-Thermally Actuated Microgrippers with Integrated Force Feedback.

1: Introduction

Microfabricated grippers and tweezers are promising tools for manipulation of micro and nanoscale objects. As with ordinary macroscale grippers, the ability to sense the forces involved in grabbing would be advantageous for controlling the operation as well as measuring the mechanical properties of the grabbed object. A simple design according to an embodiment of the invention is presented for an electro-thermally actuated microfabricated gripper capable of providing a piezo-resistive readout of the gripper deflection, which can be used to measure the forces applied to the grabbed object. Measurements of actuation of test devices are presented and found to be in reasonable agreement with expected values. Finally, piezoresistive measurements of the gripper deflection are demonstrated.

The ubiquitous presence of gripping tools in everyday workshop processes makes microgrippers interesting tools for handling micro- and nanoscale objects. In recent years several designs for microfabricated grippers and tweezers have been demonstrated. These range from almost millimetre-sized grippers made from two chips bonded together with a bimetal cantilever and piezoresistive sensor cantilever, see Greitmann, G. and R. A. Buser, Tactile microgripper for automated handling of microparts. Sensors and Actuators A: Physical, 1996. 53(1-3): p. 410-415, or electro discharge machined (EDM) grippers with optical force-feedback, see Ansel, Y., et al., Development of tools for handling and assembling microcomponents. Journal of Micromechanics and Microengineering, 2002. 12(4): p. 430-437, over submillimetre electro-thermal and electrostatic microgrippers, see Boggild, P., et al. Customizable nanotweezers for manipulation of free-standing nanostructures. in IEEE-NANO 2001. 2001: IEEE; and Molhave, K., et al., Towards pick-and-place assembly of nanostructures. Journal of Nanoscience and Nanotechnology, 2004. 4: p. 279-282, to carbon nanotube tweezers for handling objects on the nanometer scale, see Kim, P. and C. M. Lieber, Nanotube nanotweezers. Science, 1999. 286(5447): p. 2148-50; and Akita, S., et al., Nanotweezers consisting of carbon nanotubes operating in an atomic force microscope. Applied Physics Letters, 2001. 79(11): p. 1691-3. Recently, microfabricated devices have become commercially available from companies such as Zyvex and Nascatec. The actuation of grippers is often based on either electrostatic attraction, such as comb drives, see Kim, C.-J., et al., Polysilicon microgripper. Sensors and Actuators, A: Physical, 1992. 33(3): p. 221-227, or parallel flexible beams see Boggild, P., et al, or on thermal expansion of parts by resistive heating to move the actuator. Thermal actuators have been made in many designs such as two- or three-beam actuators, see Kolesar, E. S., et al., Single- and double-hot arm asymmetrical polysilicon surface micromachined electrothermal microactuators applied to realize a microengine. Thin Solid Films, 2002. 420-421: p. 530-538; and Hashiguchi, G. and H. Fujita, Micromachine Nanoprobe and its Application. Proceedings of IEEE Sensors, 2002. 1(2): p. 922-925 and even by design optimization algorithms, see Jonsmann, J., O. Sigmund, and S. Bouwstra. Compliant electro-thermal microactuators. in Micro Electro Mechanical Systems, 1999. MEMS '99. Twelfth IEEE International Conference on. 1999: IEEE.

Although adhesion forces generally make pick-and-place operations difficult on micro- and nanometer length scales, biological cells, see Jericho, S. K., et al., Micro-electro-mechanical systems microtweezers for the manipulation of bacteria and small particles. Review of Scientific Instruments, 2004. 75(5): p. 1280-1282, as well as nanoscale objects, have successfully been manipulated by tweezers, see Molhave, K., et al., Kim, P. et al. and Akita, S., et al.

For successful manipulation of a macroscale object, control of the gripping force is usually advantageous. For automated pick-and-place processes, force-feedback also enables a quick detection whether an object has been grabbed. As still smaller objects are being manipulated, there is also a fundamental interest in studying the forces involved in gripping micro- and nanoscale objects. Force detection between a single tip and a surface is done routinely by Atomic Force Microscopy (AFM), but AFM is usually limited to planar structures on surfaces. A microgripper with sensitive force feedback would make force measurements possible on three-dimensional objects. To date, devices that provide such feedback signals have only been sparsely reported in literature, and it will be difficult to scale structures such as the EDM fabricated device, see Greitman. G. et al., or bonded-chips structures, see Ansel. Y. et al., with the required precision to the size required for manipulation of nano- and micrometer objects.

The following presents a simple design of an electro-thermally actuated microfabricated gripper capable of providing a force feedback signal. The design is based on a simple actuator/sensor structure consisting of three parallel beams connected by an end bar as depicted in FIG. 4a. Three-beam actuators have been demonstrated to work with other microfabricated designs, see Kolesar, E. S., et al. and Hashiguchi, G. et al., and recently it was demonstrated how such actuators are able to both open and close Nguyen, N.-T., S.-S. Ho, and C. L.-N. Low, A polymeric microgripper with integrated thermal actuators. Journal of Micromechanics and Microengineering, 2004. 14(7): p. 969.

In section 2 the basic actuation and sensor properties of the design is estimated from simple models. Section 3 presents measurements on microfabricated test devices.

FIGS. 4a and 4b shows actuation by resistive heating. The structure bends when two (or one) beam resistors are heated relative to the remaining beam(s). Black color indicates the higher and grey the lower temperature. FIG. 4a shows one hot and two cooler beams. FIG. 4b shows two hot and one cooler beam.

FIG. 16: Actuation by resistive heating. The structure bends when two (or one) beam resistors are heated relative to the remaining beam(s). Black color indicates the higher and grey the lower temperature. (a) One hot and two cooler beams. (b) Two hot and one cooler beam. (c) and (d) respectively show the calculated temperature profile for (a) and (b). (e) and 69 respectively show the calculated actuation of current for (a) and (b), compared to the measured actuation of two devices.

2: Theory of Operation

The devices presented here are all based on a fundamental actuator/sensor structure consisting of three beams connected by an end-bar as shown in FIG. 4a and FIG. 4b. The structure is made of a resistive material layer so that the beams can be heated by a current passed through them, making the end bar move sideways due to unequal thermal expansion of the three beams. The beams are made from a single material and can be defined by a single lithographical mask. Depending on the connection of the gripper arms, the design allows for several sensing-actuation configurations. Current can be applied to the actuator in two ways, shown in FIGS. 4a and 4b to make it bend sideways. If for instance current is sent through resistor 3 in 4a and led to ground through resistors 1 and 2, the actuator will bend sideways (upwards in the figure). If the current is applied in a mirrored configuration, the actuator moves in the opposite direction. Using two opposing actuators in a gripper setup as in FIG. 6 makes a gripper capable of both opening and closing the gap depending on how the driving current is applied. By connecting the actuator beams in a Wheatstone bridge configuration as shown in FIG. 7, the difference in the piezoresistive changes of the shortened and the elongated cantilevers can be measured, to give an value for the actuator deflection and hence the applied gripping force when the spring constant of the structure is known.

2.1 Mechanical Analysis

Thermal Actuation

To estimate the actuation properties of the device we assume the material properties to be independent of temperature to a first approximation. As seen in FIG. 4, each of the three beams has initial room temperature length, L, width, w, and height, h. When forces or currents are applied to bend the actuator, the beams have lengths $L_i = L(1+\alpha T_i) - F_i/k_{beam}$, i=1, 2, 3, where Ti is the average beam temperature, $\alpha$ the thermal expansion coefficient, Fi the force applied to each beam by the end-bar, and $k_{beam}$ the tensile spring constant of the beam. For small range actuation A<<L, as in FIG. 4b, we can approximate A=L$\Theta$, where L$\Theta$=($L_1-L_3$)/4 w. With forces and moments in equilibrium, one finds that $$A = \alpha \frac{L^2}{4w} \Delta T,$$

with the beam average temperature difference $\Delta T = T_1 - T_3$ between the hot and cold beams. For the gold structure shown in FIG. 6 the calculated actuation is 1.7 µm pr 100 K temperature difference.

Actuator Spring Constant

The spring constant of the three-beam structure can be calculated from the actuation A(x) of a single cantilever beam when applied a transverse force FL and moment ML at the tip $A(L) = 12(M_L L^2/2 - F_L L^3/3)/(Ehw^3)$ with Youngs modulus E=78 GPa for gold. Upon combining three beams into an actuator, the bending moments of the three beams will equal that of the tensile forces in the individual beams if the end bar is at an angle $\Theta = A'(L) = 12(M_L L - F_L L^2/2)/(Ehw^3)$ giving $3M_L = -8 w^2 k_{beam} A'(L)$ with tensile spring constant of the individual beam $k_{beam} = Ewh/L$. The spring constant, $k_{act}$ when pressing the actuator sideways as $F_{act} = 3F_L = -k_{act} A(L)$ can then be shown to be $$k_{act} = \frac{11}{4} Eh \left(\frac{w}{L}\right)^3$$

For the gripper in FIG. 6, $k_{act}$=2/N/m. The thermally actuated grippers are generally more rigid than electrostatically actuated grippers with similar lengths. The presented gripper is about 10 times more rigid than a correspondingly sized electrostatic gripper with a cantilever actuator with dimensions of a single beam.

2.2 Thermal Distribution

The average temperature of beam 1 and 3 can be calculated from the temperature distribution, T(x), found by analytically solving the heat conduction continuity equation T"(x)=−(x), where $C(x) = J^2(x)\rho/\kappa$, with current density J(x) (constant in each beam), electrical conductance $\rho$, and heat conductivity $\kappa$. To estimate the properties of the gripper we will assume that convective and radiative heat losses can be neglected.

With an applied current I, we find a temperature distribution for the structure in FIG. 4a as function of distance along the structure. The maximum temperature in the beam is $T_{max} = (9I^2\rho)/32$ κwh). The current must be limited so $T_{max} < T_{limit}$ where $T_{limit}$ is typically some fraction of the material melting point to avoid damaging the structure.

Naturally, one should also consider the temperature limits of the objects to be manipulated when defining $T_{limit}$. By averaging the temperature distribution in beam 1 and 3 we find the average temperature difference as function of applied current $\Delta T = (I^2\rho)/(16 \kappa wh)$. The maximal temperature difference $\Delta T_{limit}$ achieved when $T_{limit}$ is reached and is $\Delta T_{limit} = 2 T_{limit}/9$.

We can now express the actuation as function of current for the configuration in FIG. 4a:

$$A = \frac{\alpha \rho}{\kappa} \frac{L^2}{64 w^2 h} I^2$$

The maximal actuation is $A_{limit} = (\alpha L^2 T_{limit})/(18 w)$. Using the melting point of gold as $T_{limit}$ gives an upper estimated actuation range for the test device of about 4 µm at a current $I_{limit}$=146 mA and an actuation voltage of 230 mV.

If the heating current is applied as in FIG. 4b rather similar results are obtained with the maximal actuation 8% larger than in the case of FIG. 4a. However, the maximal temperature is in this case reached in both hot beams in FIG. 4b whereas the two cold beams in FIG. 4a only reaches 90% $T_{max}$. In the following we will use the setup in FIG. 4a to avoid the highest temperatures in the beams used as piezoresistors.

2.3 Piezoresistive Sensitivity

The piezoresistive change in the beam resistance $\delta = \Delta R/R$ can be calculated from the gauge factor K and change in length $\Delta L/L$ due to tensile forces in the individual beams as $\delta = K \cdot \Delta L/L$. For silicon, the gauge factor can be up to >100, see Thaysen, J., et al., Atomic force microscopy probe with piezoresistive read-out and a highly symmetrical Wheatstone bridge arrangement, Sensors and Actuators A: Physical, 2000. 83(1-3): p. 47-53, while for gold it is about 4, see Jen, S. U., et al., Piezoresistance and electrical resistivity of Pd, Au, and Cu films. Thin Solid Films, 2003. 434(1-2): p. 316-322.

\*\*

Accurate measurements of the piezoresistive response can be done using a Wheatstone bridge to reduce noise by measuring the change in a resistor relative to a network of thermally similar resistors, see Thaysen, J., et al. A standard Wheatstone configuration as shown in FIG. 7 would give a signal $V_{out} = (\delta_1 - \delta_2 - \delta_3 + \delta_4) V_{in}/4$ if all resistors have almost equal values $R_i = R(1+\delta_i)$. In the three-beam actuator designs shown in FIGS. 5 and 8, the stress induced by pushing the three-beam sensor sideways gives $V_{out} = V_{in} \delta/2$. The force sensitivity SF of these sensor designs can be calculated from the equations in Sect. 2.1 to give:

$$S_F = \frac{V_{out}}{V_{in}F_{grip}} = \frac{2KL}{33w^2hE}$$

For the gold device presented here the sensitivity is estimated to be 0.1 mN1, or 0.1 mV per μN of gripping force per Volt applied to the gripper. The position sensitivity $S_x = Kw/(6L^2) = 140$ VV−1m−1, so moving the gripper tip 1 μm should give 0.14 mV output signal per applied Volt.

The calculated sensitivity is comparable to that found in some other devices made from materials with higher piezoresistive coefficients, see Greitman. G. et al., however the applicable voltages are limited by the maximally allowable current to avoid reaching $T_{limit}$.

In the configuration of FIG. 8, the applied voltage will also lead to actuation and the thermally induced stress in the structure will give an additional contribution Vadd to the measured signal from the sensor Vmeas, which must be subtracted from the measured signal to obtain the true signal due to deflection Vout=Vmeas−Vadd.

Vadd can be estimated as $V_{add} = 2KwA/L^2$. This is proportional to 12 and can reach a voltage of order mV for the gold gripper. Thus, Vadd can be orders of magnitude higher than the gripping force signal Vout. Since the error in the piezoresistive signal is expected to be proportional to $V_{in}^2$, this voltage should be kept as low as possible. The best method for measuring Vout is Lock-in detection of an oscillating signal sufficiently small to avoid oscillating actuation—a DC voltage can be added for simultaneous actuation.

FIG. 6 shows an image of the piezoresistive feedback test device. FIG. 7 shows a typical Wheatstone bridge resistor configuration. FIG. 8 shows a gripper made with two actuators in the configuration from FIG. 4*a* connected as a Wheatstone bridge circuit. FIG. 5 shows a gripper configuration with three, three-beam structures connected to avoid thermal stress influencing the sensitive force detection.

For a more sensitive detection of the gripping force one can use the Wheatstone bridge setup shown in FIG. 5, which is not influenced by thermal stress caused by the voltage applied for piezoresistive measurements in the structure—and one can then use the slightly more efficient configuration from FIG. 4*a* or other suitable actuator designs for actuation.

The setup in FIG. 8 is sensitive to the sum of forces applied to the gap and will show the same signal if the both actuators touch an object with force Fgrip or only one gripper touches with a force 2Fgrip. Interchanging the leads to the beams R2 and R4 will make the output voltage independent of symmetrical stress due to actuation or applied forces. The interchanged Wheatstone bridge configuration will then give a signal if the object is only in contact with one actuator, which could be useful when positioning the gripper for applications such as automated pick-and-place processes. The controlling electronic circuit could be made to alternate between the two measurement modes to give both signals while maintaining a constant actuation current.

If one increases the complexity of the device by using two conducting layers separated by an insulating layer, instead of just one conducting layer, it should be possible also to both sense and control out-of-plane bending actively.

FIG. 17: Piezoresistive feedback (a) optical image of the test device. (b) A typical Wheatstone bridge resistor configuration. (c) Gripper made with two actuators in the configuration from FIG. 16*a* connected as a Wheatstone bridge circuit. (d) Gripper configuration with three, three-beam structures connected to avoid thermal stress influencing the sensitive force detection. (e) and (f) piezoresistive measurements on the setup in (c) and (d), respectively, made by deflecting the gripper tip a distance d (in the direction of $F_{grip}$) while applying a voltage of about 10 mV@] kHz using lock-in detection. (e) Piezoresistive signals $V_{out}$ as function of deflection d when opening the gap by opening and closing each actuator repeatedly (square and circle markers indicate deflection of the left and right part). (t) Piezoresistive signal when deflecting the sensor in (d) back and forth from the neutral position.

3 Experimental Results

To test the design and above analysis, grippers were microfabricated in gold, with beam length L=100 μm, width w=2 μm and height h=1 μm. The process is described elsewhere, see Mateiu, R., et al., An approach to a multi-walled carbon nanotube based mass sensor. Microelectronic Engineering, 2004. 73-74: p. 670-674. The present devices are not suitable for manipulation since the aspect ratio h/w is less than one, see Jonsmann, J., 0. et al., and we observe some out of plane bending during actuation. For real applications, the aspect ratio should be increased to at least 3, which can be achieved by standard microfabrication methods. For increased piezosensitivity of the device, one should also consider using a different material than gold to obtain a higher resistivity and gauge factor (K). However, high K values are often combined with larger thermal variations in the piezoresistivity, thus for the present demonstration purposes gold was considered a suitable material.

3.1 Measurement of Actuation

The actuation is measured by an image analysis program capable of extracting the position of the lips of the grippers with approximately 10 nm precision from live video images in a Labview controlled setup based on a 100× Navitar microscope. The applied actuation current is limited to 30 mA in order not to damage the devices, and to avoid both annealing effects/drift as well as loss of precision in the measurement precision of actuation due to out-of-plane bending at the highest temperatures. Actuation up to 3 μm has been observed when applying higher currents with the configuration in FIG. 4*a*, but high currents often resulted in destruction of the devices.

As expected, the configuration in FIG. 4*b* does actuate more than the one in FIG. 4*a* at a fixed current. The measured actuation is consistently lower than the estimated values, which is likely due to the neglected convective and radiative heat losses in the above analysis as well as out-of-plane bending.

3.2 Piezoresistive Measurements

A Stanford SR830 lock-in amplifier was used as voltage source in FIG. 8 for the piezoresistive measurements and was connected in series with a 1 kΩ protective resistor to give a 1 mA current (The device resistance is calculated to be 1.6Ω). The actuator tip was deflected by a sharp silicon wafer edge mounted on a Newport Motion Controller capable of moving the sample in 100 nm steps. The measured output voltage is shown as a function of deflection of the tip for the structure in FIG. 8. The configuration of FIG. 8 is sensitive to the opening of the gap and the two actuators give the same signal as they are individually deflected to open the gap. The configuration in FIG. 5 senses only the forces applied to one part of the gripper. At the maximal deflection of the structure, out-of-plane bending was visible in the microscope, which might cause the decrease in sensitivity at high deflections. The applied voltage over the three-beam device should be about 1 mV, giving a measured sensitivity for all tested structures about 10 μV V' μm−1 which is a factor of 15 less than expected. The observed out-of-plane bending during deflection is expected to be a significant source of error.

4: Conclusion

An analysis was presented to estimate the actuation range and piezoresistive sensitivity of an electrothermally actuated micro fabricated gripper based on a three-beam actuator/sensor structure. Several configurations using the same three-beam structure have been analysed to evaluate the actuation range and sensitivity (FIG. 4a-4b and FIG. 5 and FIG. 8). Measurements on test devices made in gold showed actuation in good accordance with the theory and an actuation range sufficient to close the gap if defined by the same line width as the actuator beam structure itself. If the gap of the presented device is opened by 4 µm to grap a 4 µm object and the closed by a corresponding current, the gripping force is of the order 15 µN. The device spring constant is proportional to the device height and much larger gripping forces approaching the mN range would be possible in devices with high aspect ratios.

The piezoresistive sensitivity was found to be about a factor of 15 lower than the calculated value. The sensitivity and reliability of the presented device is likely to be considerably improved by increasing the aspect ratio to avoid out-of-plane bending. Increased piezoresistive sensitivity must also be expected if the device is made from silicon or polysilicon rather than gold. Finally, the structure shown in FIG. 5 should provide a better piezoresistive signal than the structure in FIG. 8, since the stress caused by the current in the Wheatstone bridge should have no influence on the piezoresistive signal.

BRIEF DESCRIPTION OF THE DRAWINGS

In the following the invention will be described in a non-limiting way and in more detail with reference to exemplary embodiments illustrated in the enclosed drawings, in which:

FIG. 4a shows one hot and two cooler beams, FIG. 4b shows two hot and one cooler beam;

FIG. 10a shows chips developed to fit directly into a standard TEM probe holder; FIG. 10b shows TEM holders with space to use larger chips; FIG. 10c shows a mobile station with two xyz stages;

FIG. 15a illustrates IV curves; FIG. 15b illustrates the currents vs. curves in FIG. 15a; and FIG. 15c is a G vs. P graph;

FIG. 16a illustrates one hot and two cooler beams; FIG. 16b illustrates two hot and one cooler beam; FIGS. 16c and 16d respectively, illustrate the calculated temperature profile for FIG. 16a and FIG. 16b; and FIGS. 16e and 16f respectively, illustrate the calculated actuation of current for FIGS. 16a and 16b.

DETAILED DESCRIPTION OF PREFERRED EMBODIMENTS

Figure 1:
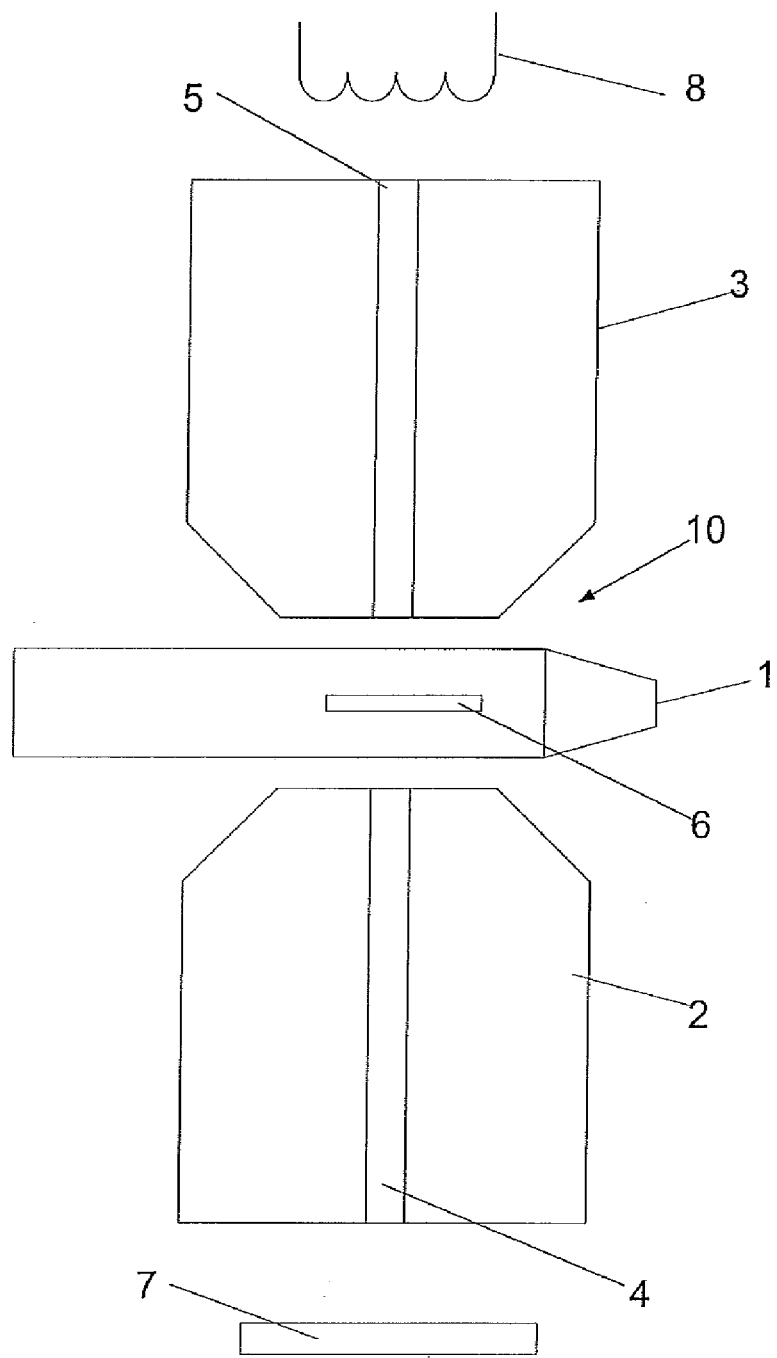
FIG. 1 illustrates a schematical side view of a TEM probe holder in situ of a TEM according to the present invention.

In FIG. 1, reference numeral 1 generally indicates a transmission electron microscope probe holder for use in situ of a transmission electron microscope (TEM). The probe holder is arranged during operation between two electron beam lenses 2 and 3 together forming a small gap 10 there between. Through each electron beam lens 2, 3 is an opening 4, 5 for electrons to pass through. An electron beam is formed by emitting electrons from an electron emitter 8 and the electrons are steered into a beam using the electron beam lenses 2, 3. The TEM is used for imaging small structures in a sample 6 by directing the electron beam through the sample and collecting electrons with an electron collecting device 7, such as a charge coupled device (CCD) or similar technique, sometimes also a fluorescent device may be used in order to convert the electron beam image into a photon based image for optical inspection by a user of the TEM. The TEM is a complex measurement device with a vacuum inside for allowing electrons to travel a considerable distance undisturbed. The probe holder 1 is entered into the TEM through a vacuum port with a gate function for keeping the vacuum inside the TEM essentially intact during mounting of the probe holder 1.

However, the TEM system in itself is only arranged to obtain images on samples and are generally not equipped to do any other types of measurements, apart from electron spectroscopy or similar electron based measurements as understood by the person skilled in the art. Often, it is of interest to determine electrical, mechanical or other properties of a sample but these are generally not available measurements in the TEM using standard equipment, and the present invention provide a solution for measuring different physical properties in situ of the TEM.

Figure 2:
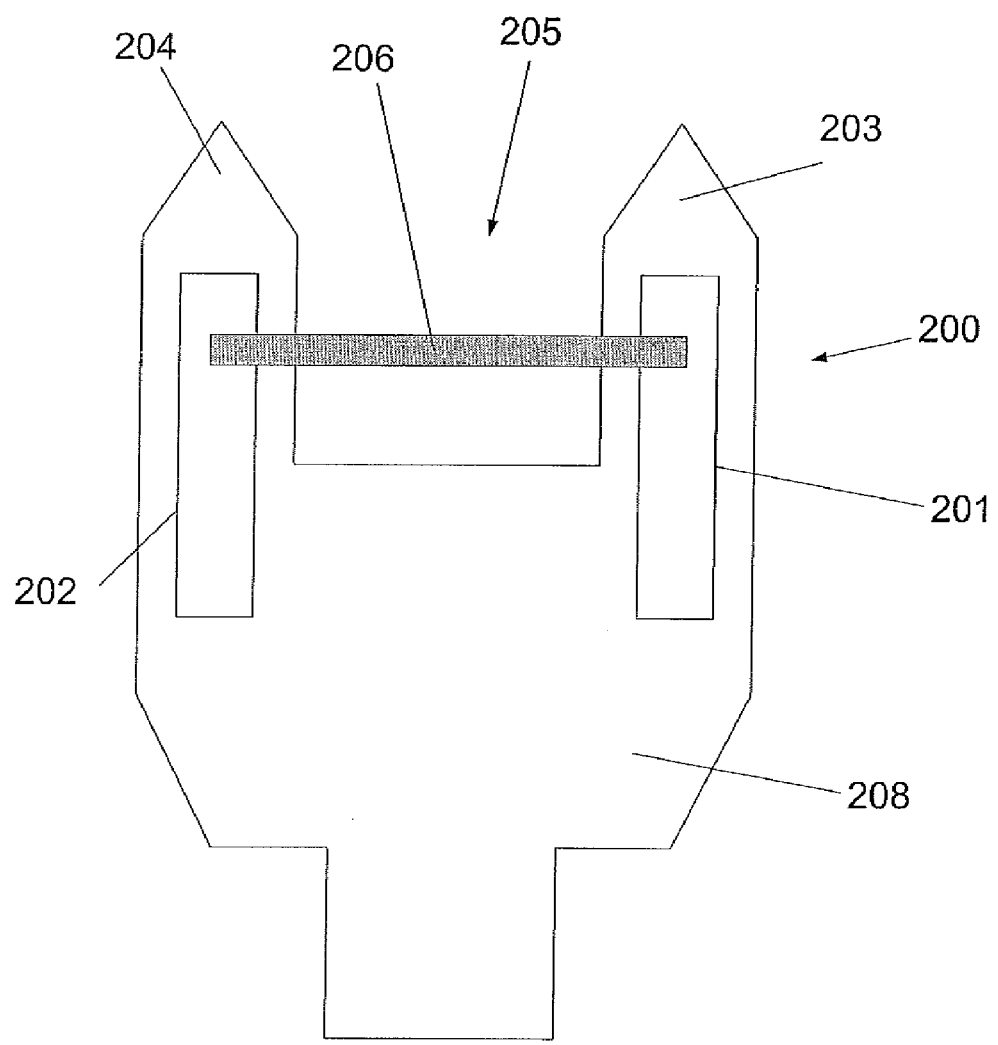
FIG. 2 illustrates a TEM Chip according to the present invention.

FIG. 2 illustrates a so called TEM Chip 200 used as sample holder for measuring mechanical and/or electrical properties of a sample 206 positioned between two arms 203, 204 protruding out from a substrate 208 of the TEM Chip 200. Each arm 203, 204 is provided with at least one connector 201, 202 onto which a part of the sample 206 may be placed. If the sample is longer than a gap 205 between the two arms 203, 204 it may form a bridge between the arms. An electron beam may then pass through the sample in the gap 205 area under inspection and the sample have at the same time mechanical and optionally electrical contact with the connector of each arm 203, 204. Thus, it is possible to apply electrical and/or mechanical excitation or measure electrical and/or mechanical properties of the sample simultaneously with acquiring images using a TEM (or SEM or any other imaging equipment). Below in document description of how to apply mechanical forces to the sample will be found. At least one connector (electrical and/or mechanical) is provided on each arm 203, 204 for mounting the sample 206 to the sample holder 200.

The TEM chip 200 may be produced in any suitable material as understood by the person skilled in the art of microfabrication, e.g. silicon based materials.

Figure 3:
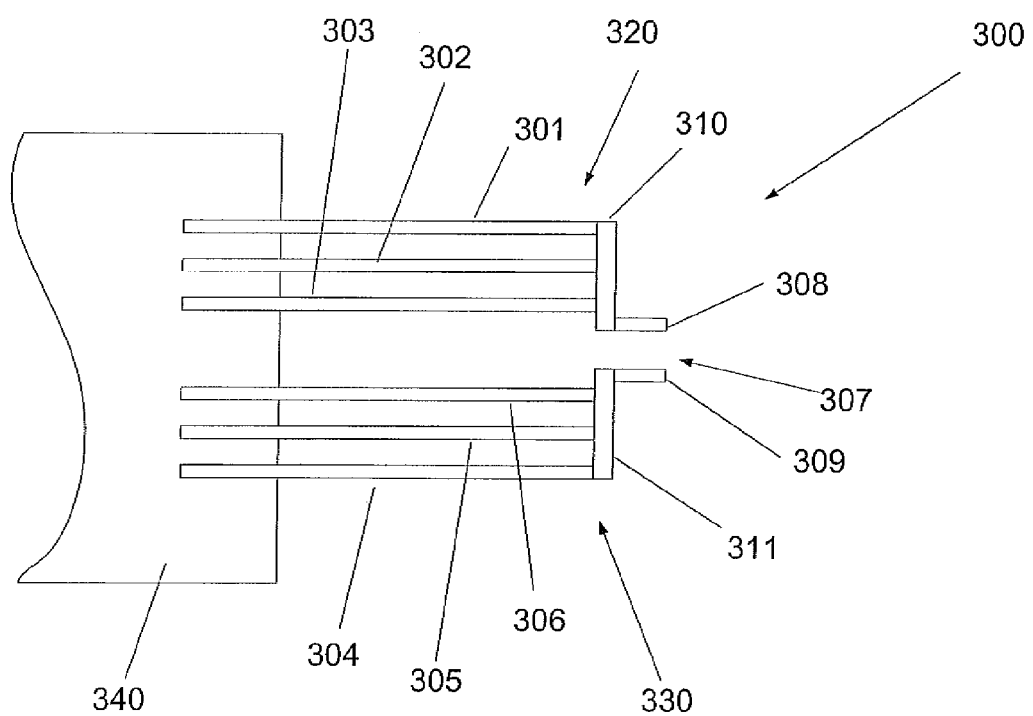
FIG. 3 illustrate a TEM nano gripper according to the present invention.

FIG. 3 illustrates a microfabricated TEM Chip with a nano positioning possibility of each arm 320, 330. Each arm 320, 330 comprise three actuator beams 301-306, each actuator beam with at least one electrical connection (not shown) for applying signals to the beam. Each arm 320, 330 are at a distal end away from the electrical connection connected mechanically and electrically through a connection bar 310, 311 and on each connection bar is a protruding gripper 308, 309 located. The two grippers 308, 309 are located on each connection bar and close to each other forming a gap 307 between them. The actuator beams 301-306 are formed on a substrate 340 and protrude out from this substrate 340 forming cantilevers. A current can be applied to each of the beams 301-306 of each arm 320, 330 and the beams may be made of a resistive material which will heat up due to the applied current. Depending onto which beams of the arms the current is applied to, they will bend or deflect in different directions. The protruding gripper may be provided with a connector for electrical and/or mechanical connection of a material sample as has been described in relation to FIG. 2. The gripper 308, 309 may also be adapted to enter into a receiving structure of sample (similar to a fork lift entering into a pallet) for lifting or tensile force application of the sample.

The device as illustrated in FIG. 3 may provide a large range of gripping forces, from the nN range up to the mN range depending on geometrical parameters and applied current.

Figure 4:
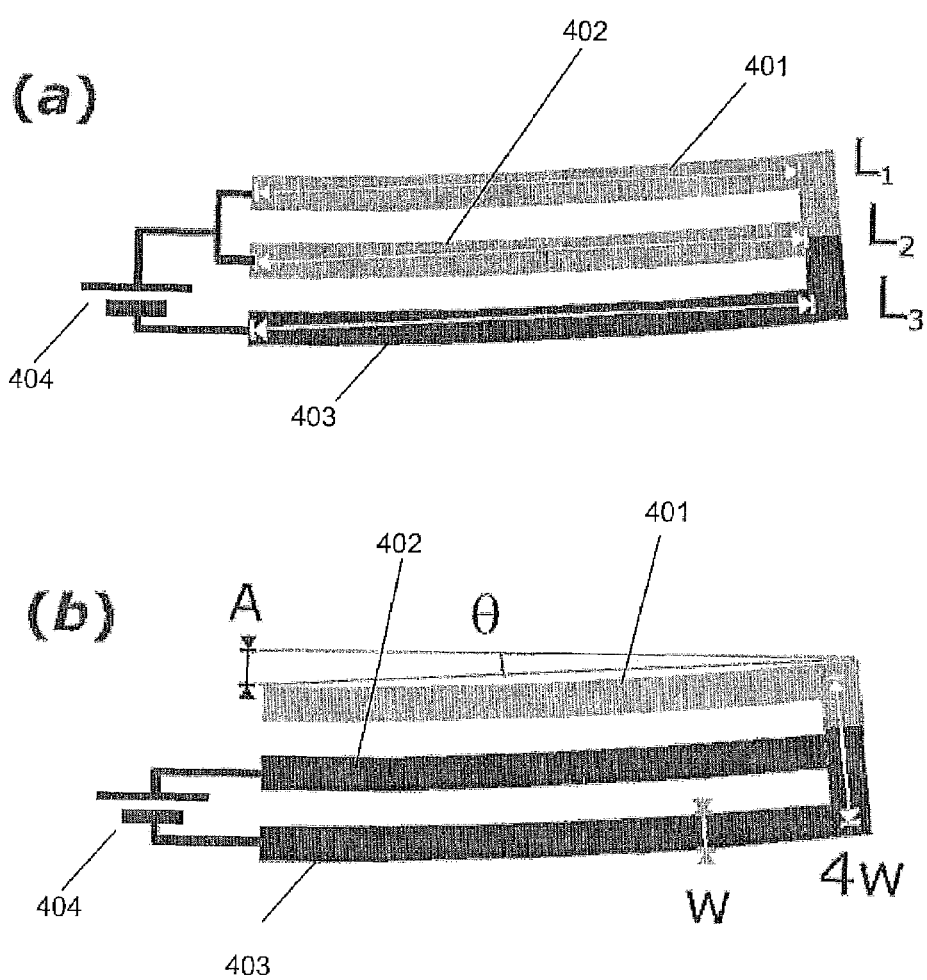
FIG. 4 illustrate movement of the nano gripper from FIG. 3.

FIG. 4 illustrates some examples of bending directions as a function of applied current. In FIG. 4 a single arm 400 is shown comprising three beams 401-403. If a current is passed through one beam 403 in series with two beams 401 and 402 in parallel, the current density will be larger in beam 403 thus increasing the temperature in this beam 403 more than in the two beams 401, 402 in parallel. Due to the temperature difference the beams will be elongated differently; the single beam 403 will therefore be elongated more than the other two beams 401, 402 and a bending force will be applied to the arm 400 formed by the combined beams 401, 402, 403 as illustrated in FIG. 4a. In FIG. 4b another variation of applying a current is shown, where a current is passed through two beams 402, 403 but not through the remaining beam 401. This will lead to a temperature increase in the two beams 402, 403 where the current is passed through and thus again a bending force will be applied to the arm 400. By applying the current in a different fashion, for instance through beams 401 and 402 the arm 400 will bend in the other direction. Two such arms 320, 330 can thus form a gripper by applying currents in different beams of the arms. Reference numeral 404 depicts a signal source for generating a current through the actuator beams. This type of movement is some times referred to as electro-thermal actuation.

The same solution may be applied for forming a tensile measurement device. If a sample is located between two grippers 308, 309 and mechanically fixed at the ends of the sample located on the grippers and the grippers are made to move as described in relation to FIG. 4, it is possible to apply forces to the sample; e.g. for tensile testing or other mechanical testing of the sample. By knowing the force constant of the arms one can measure the effect of applied forces to the sample and view resulting mechanical stresses on the sample in situ of the TEM. Also if the sample is located with each end on an electrically conductive connector it is possible to measure electrical properties on the sample as a function of applied force while at the same time acquiring images using the TEM or applying electrical signals to the sample 206 while acquiring images using the TEM.

Figure 5:
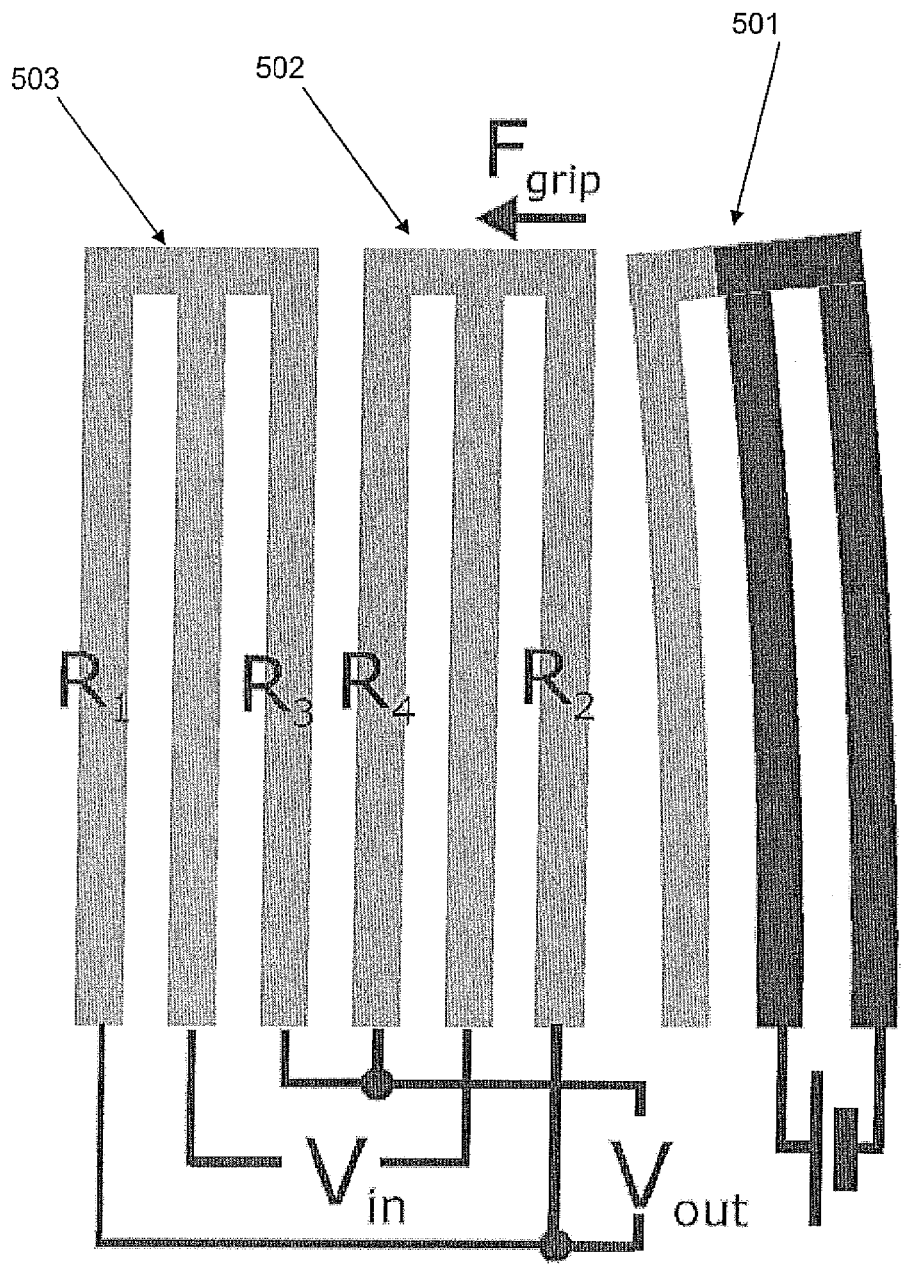
FIG. 5 illustrate another embodiment of the present invention.

Force measuring capabilities can be added to the device by designing the actuator beams in a material sensitive of bending action, for instance a piezo resistive material. This will allow for measurements of actuator beam deflections and by knowing the force constant one will be able to determine the forces applied. This is particularly useful in a tensile force measurement system but also in a nano or micro gripper application, where it is of interest to determine the forces applied to an object held by the grippers. A Wheatstone bridge may be used for increasing the sensitivity of measurements of applied forces. In order to further increase the sensitivity a Lock-in technique may be utilized; in this type of solution a small oscillating signal is applied to one or several actuator beams and when force measurements are performed measured signals are filtered with the same oscillating signal so as to amplify all signals with the same frequency and phase as the oscillating signal and no other signals are amplified. This will drastically increase the signal to noise ratio. We will not describe the Lock-in technique in more detail in this document since it is understood by the person skilled in the art. However, care need to taken in order to keep the oscillating signal small so as to not introduce an oscillating movement of the actuator beams or to keep the frequency above the mechanical reaction time of the actuator beams. Also in this type of setup a Wheatstone bridge may be used for increasing the sensitivity and decreasing the effect of inducing heat increases in the material during piezo resistive measurements (a voltage need to be applied across the electrical setup and this voltage may induce a small current leading to a heat increase in the actuator beams). One may also use a dummy arm 503 as depicted in FIG. 5, located close to the actuator arms 501, 502, for reducing unwanted and uncontrollable temperature effects; an overall temperature increase (or decrease) of the system due to piezo resistive measurements or from external factors will be applied to both the dummy arm 503 as well as the actuator arms 501, 502. By measuring a signal from the dummy arm 503 or using the dummy arm in a Wheatstone bridge the temperature effect may automatically be compensated for.

Using the shown design from FIG. 3, of three actuator beams forming a single arm, one will have a very rigid mechanical solution; of the order 10 times more rigid than prior solutions.

Figure 6:
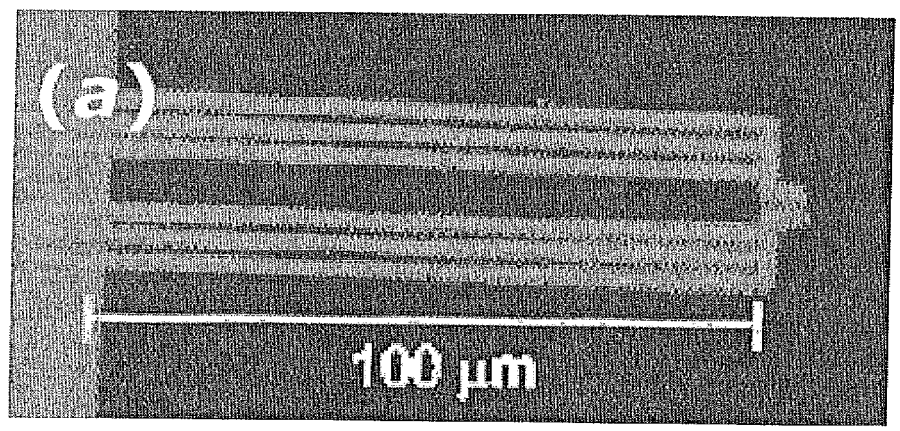
FIG. 6 is an optical image of an embodiment of the present invention.

FIG. 6 shows an optical image of a gripper 300 with beam lengths of ca 100 μm width of each beam 2 μm, and a height of 1 μm; however, the sizes and relative scaling between different components indicated of the gripper is for illustrative purposes only, other sizes and relative scaling may be utilized depending on material used, functionality desired, gripping forces desired, where the gripper is to operate and at what environmental properties (e.g. temperature, pressure and son on). The shown gripper can operate at low temperatures making it well suited for cryogenic applications and experiments.

Figure 7:
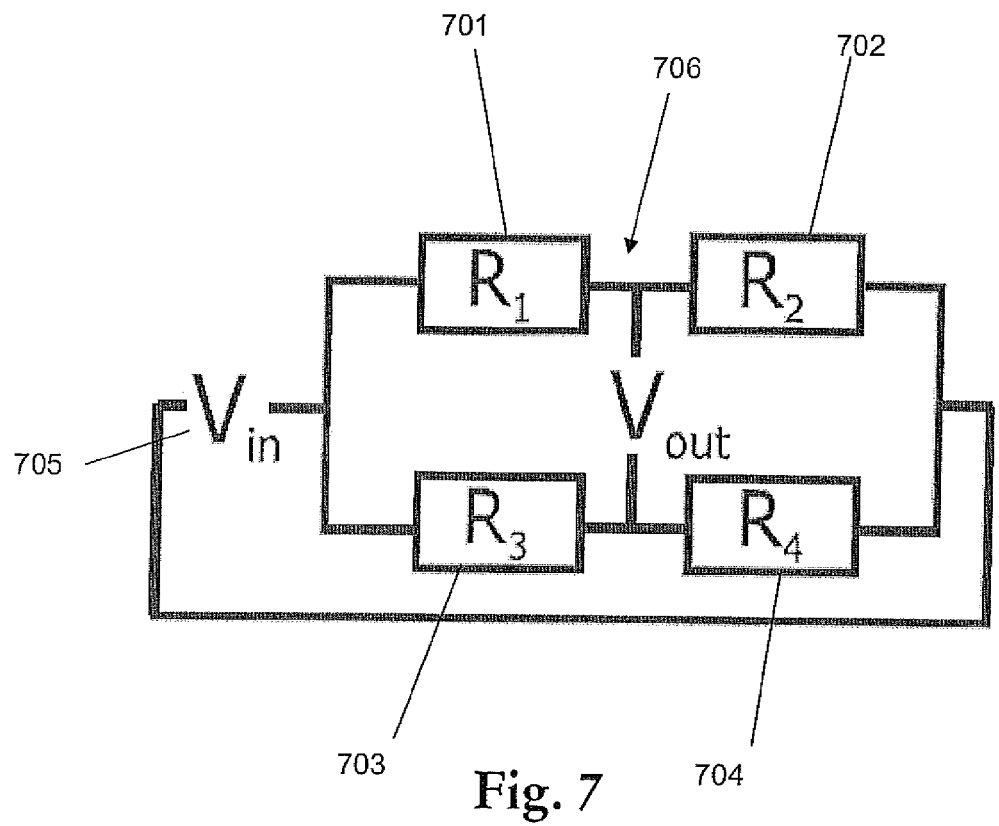
FIG. 7 is a schematical illustration of a Wheatstone bridge used in an embodiment of the present invention.

FIG. 7 is an illustration of one embodiment of an electrical circuit using a Wheatstone bridge for measuring for instance applied forces if the actuator beams are made of a piezo resistive material. The beams each form a resistor 701 to 704 in the Wheatstone bridge arrangement with a voltage source 705 applying signals across the resistor network 706.

Producing the cantilever arms with several layers with conductive and non-conductive layers between may provide sensing and control of out of plane bending. This may be provided for example by producing two conducting layers separated by one insulating layer. However, it should be understood by the person skilled in the art that more layers may be stacked in such a manner to provide the same functionality.

Figure 8:
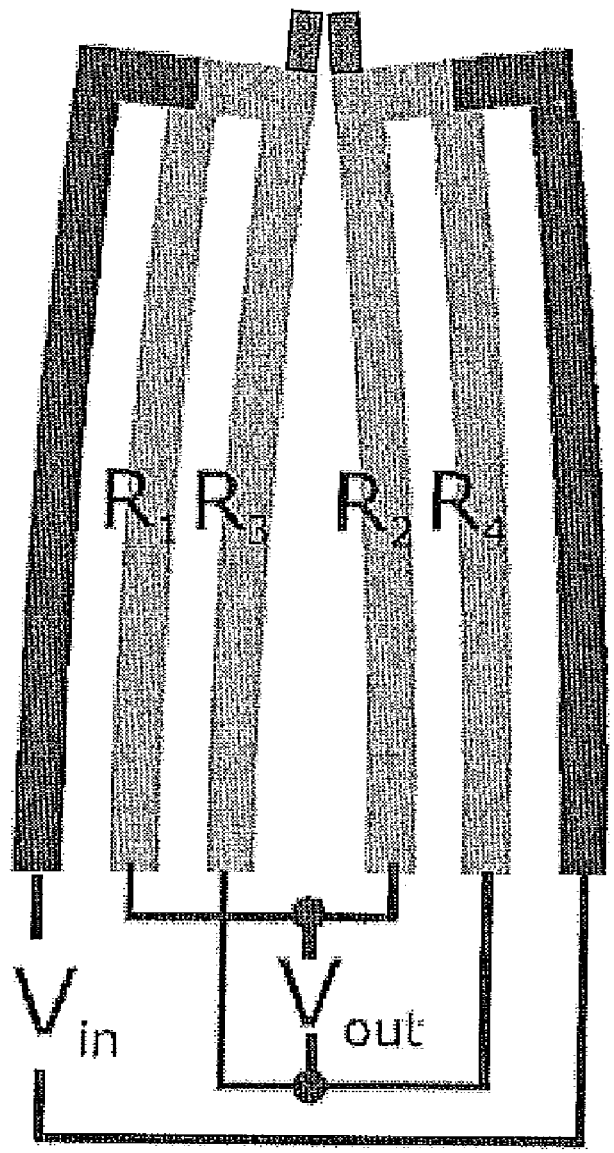
FIG. 8 is a schematical illustration of an electrical setup used in an embodiment of the present invention.

FIG. 8 illustrates an example of electrical circuit of the actuator beams for a Wheatstone configuration as also depicted in FIG. 7.

The invention as described above with a gripper function (see for example FIG. 3) a Pick-and-place device may be provided. This is a device for picking up objects, moving them to a new location and then releasing them at the new location. The setup shown in FIG. 8 is sensitive to the sum of forces applied to the gap and will provide the same signal if both the grippers touch an object with a force F or only one gripper touches with a force 2F. Interchanging the connection to the beams R2 and R4 will provide an output voltage independent of symmetrical stress due to actuation or applied forces. The interchanged Wheatstone bridge configuration may then provide a signal if the object is only in contact with one gripper. This may be useful when positioning the grippers for applications such as in automated pick-and-place processes. The electronics may be arranged to alternate between the two measurement modes to provide both types of signals while maintaining a constant actuation current. By combining the device with a gripper function according to the present invention with a nano positioning movement device, for instance an inertial slider device operating by the principle that an object to be moved (e.g. the gripper device 300) is mounted, and held by frictional forces, directly or indirectly on a piezoelectric material arranged to have a signal controlling a movement in different directions applied to it. By applying a rapid signal to the piezoelectric material this will move in such a way that the object to be moved do not follow the movement of the piezoelectric material and the thus the object to be moved moves in relation to the piezoelectric material, such an inertial slider device is described for instance in patent publication US20040051424. The invention is not limited to inertial slider nano or micro positioning devices but other solutions may be used as well.

Figure 9:
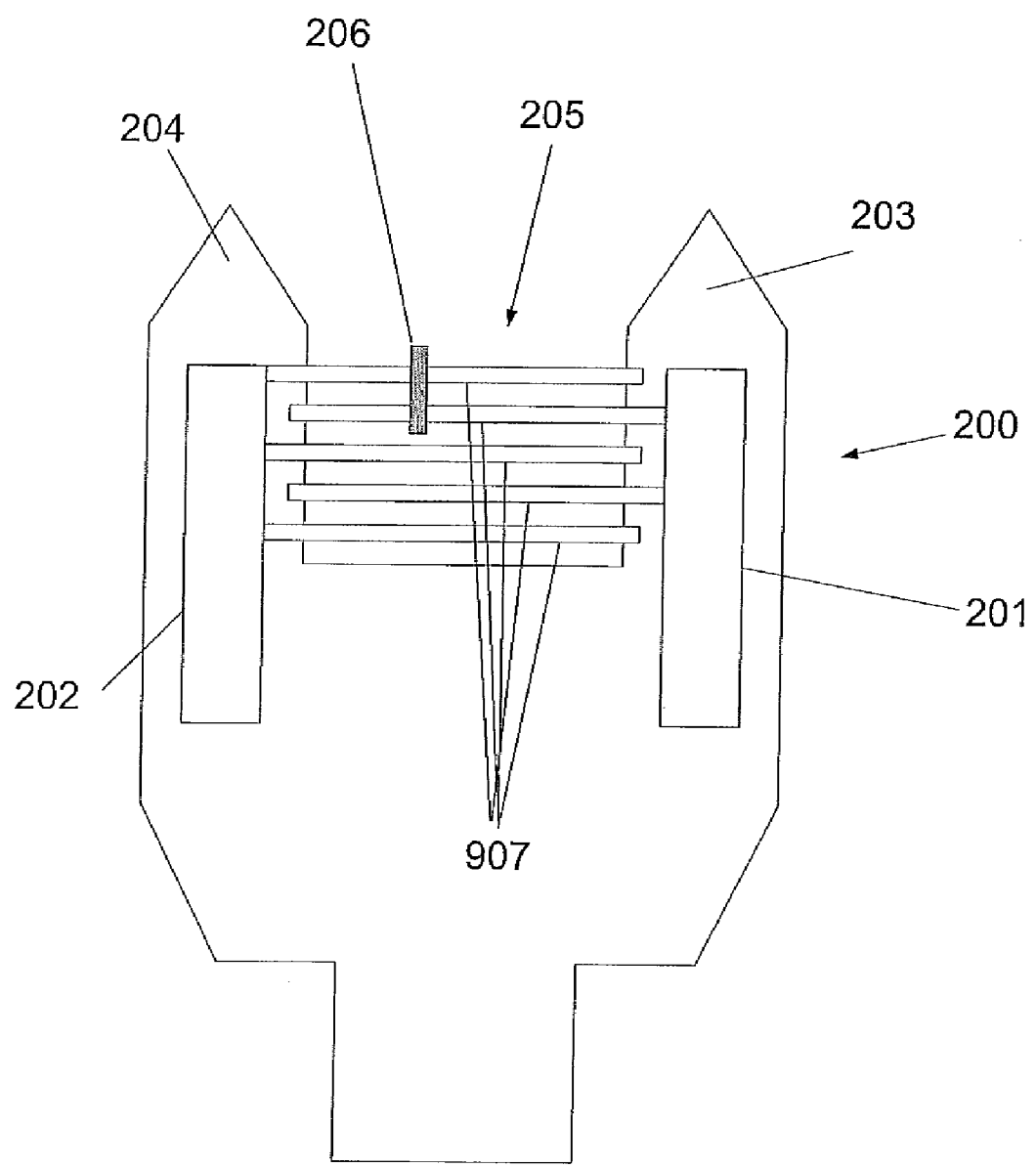
FIG. 9 illustrate schematically another embodiment of the present invention.
Figure 10:
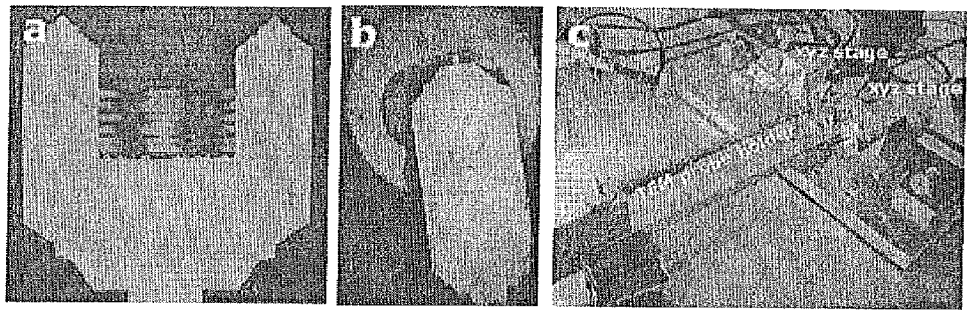
FIG. 10 is an image of the TEM-chip system.
Figure 11:
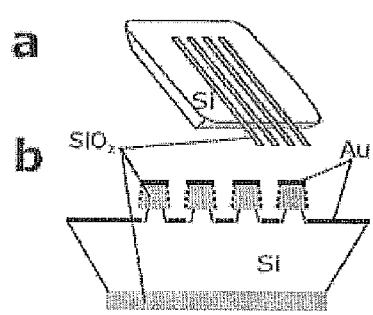
FIGS. 11a & 11b illustrate the conductance probes.
FIG. 11c is a SEM image of a conductance probe.
Figure 11:
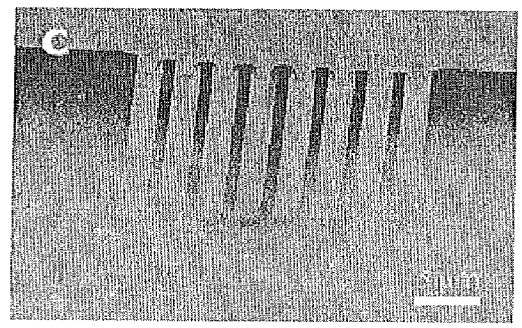
Figure 12:
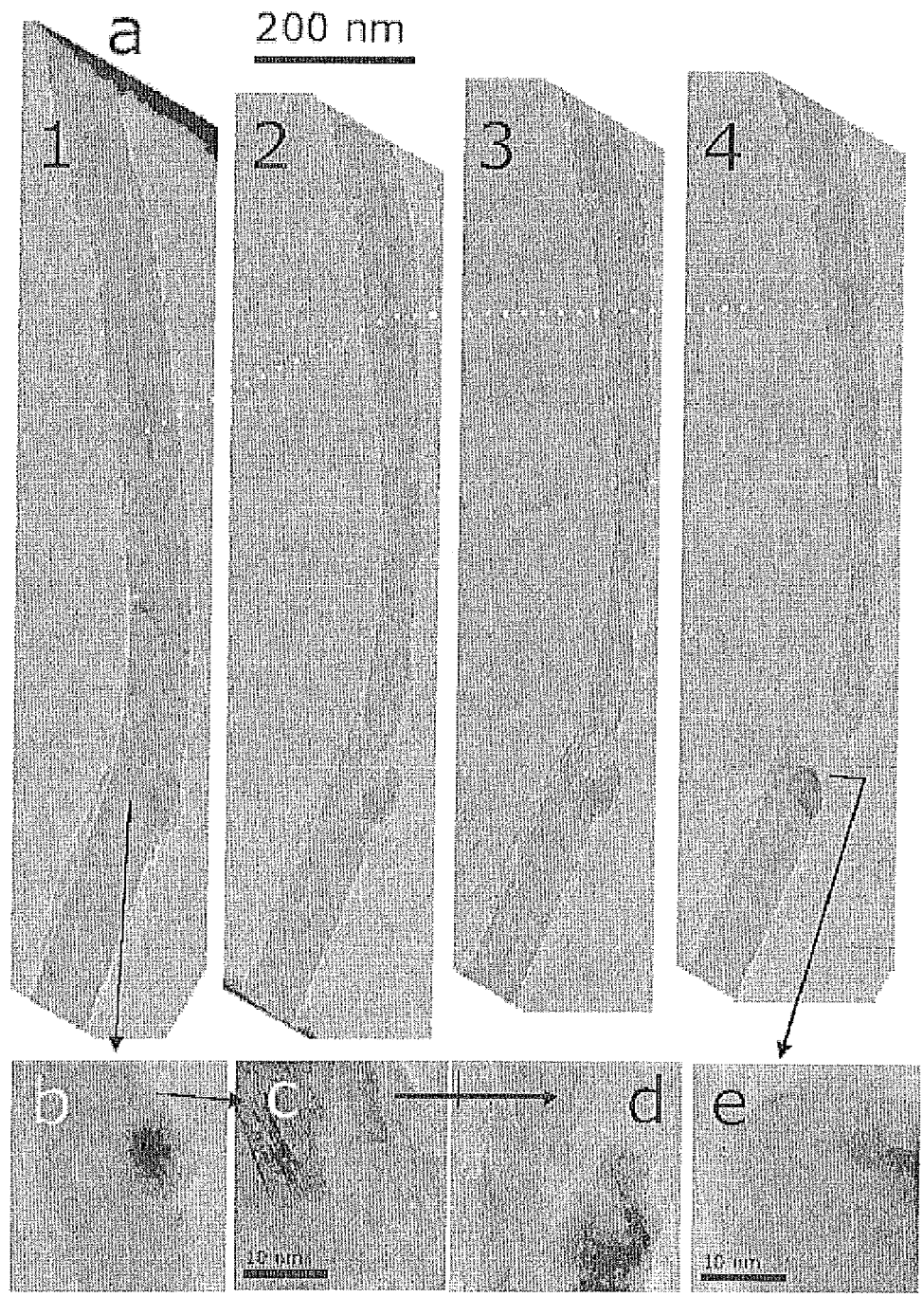
FIG. 12a is a series of TEM images of a C-MWNT.
FIGS. 12b-12e are close-ups of the TEM images.
Figure 13:
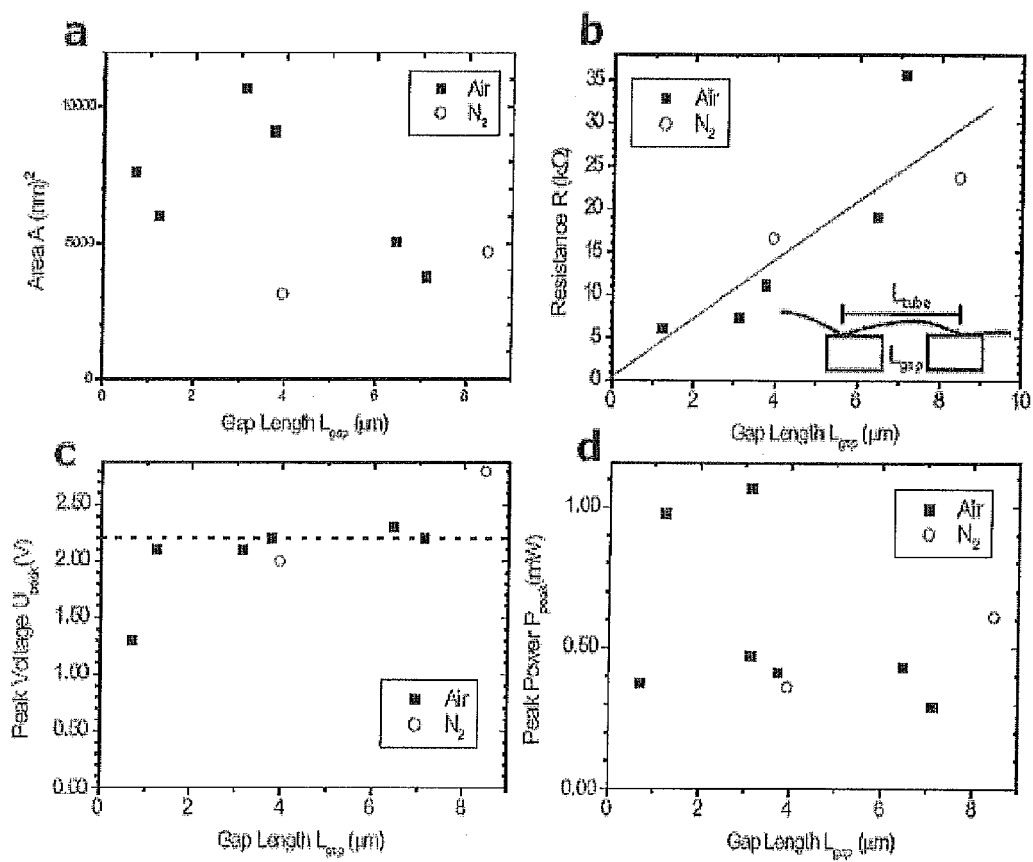
FIGS. 13a-13d illustrate graphs with an overview of the electrical properties of those devices that achieved good contact to the MWCNT (R<50 kn)
Figure 14:
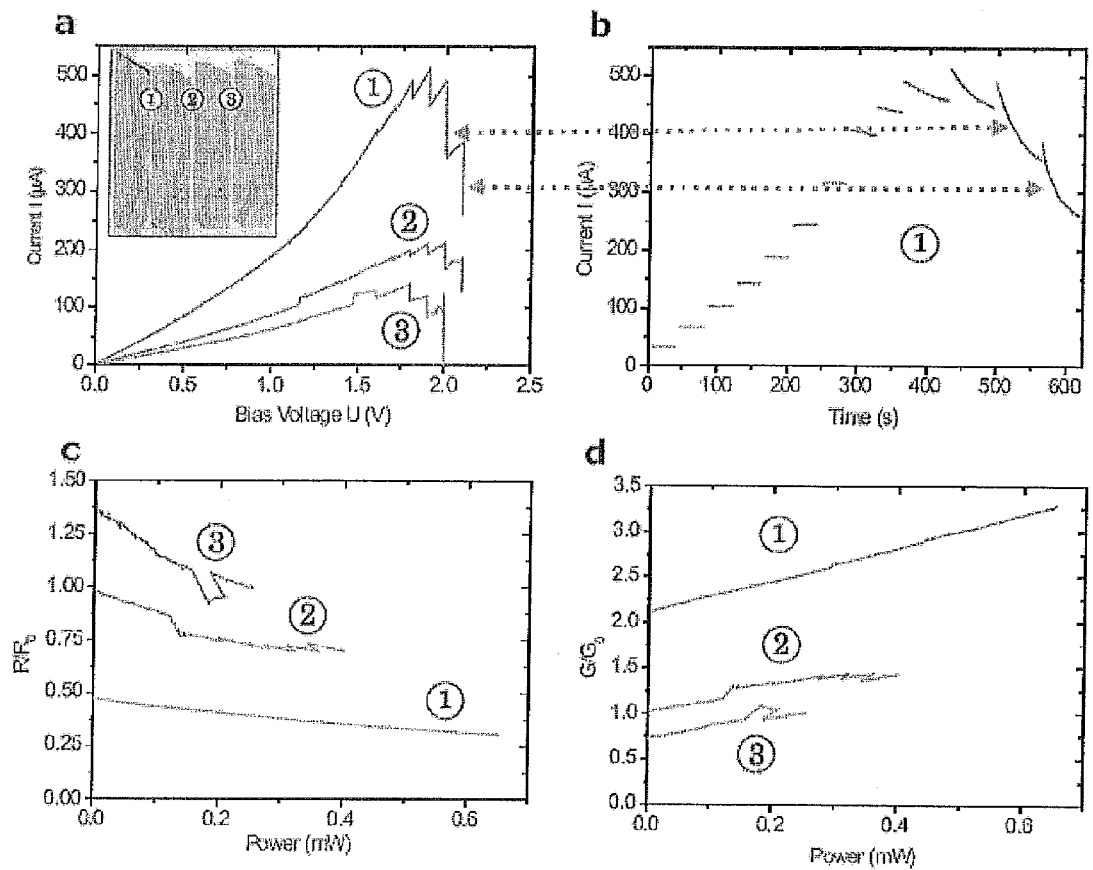
FIGS. 14a-14d are graphs illustrating electrical measurements on C-MWNT in air with both bias voltage scan and observation of the current as function of time for temporarily fixed bias voltages.
Figure 15:
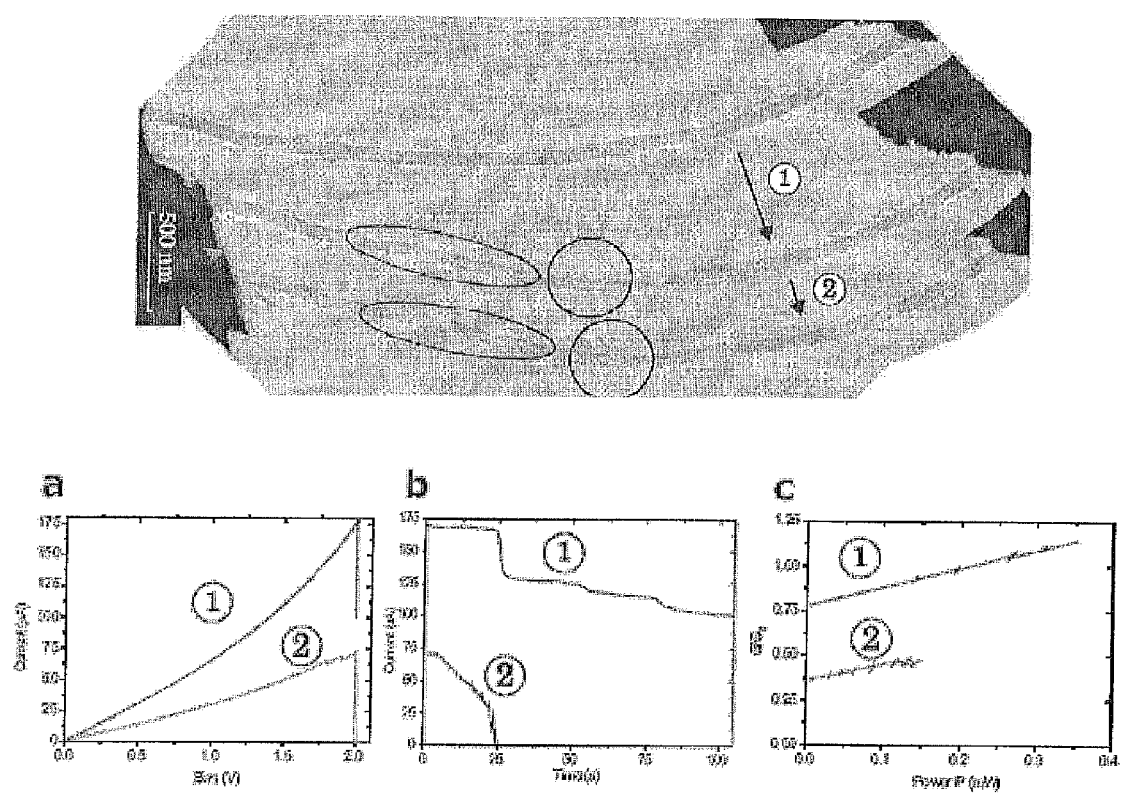
FIG. 15 is an image of shell-burn curves performed on a C-MWNT in nitrogen.
Figure 16:
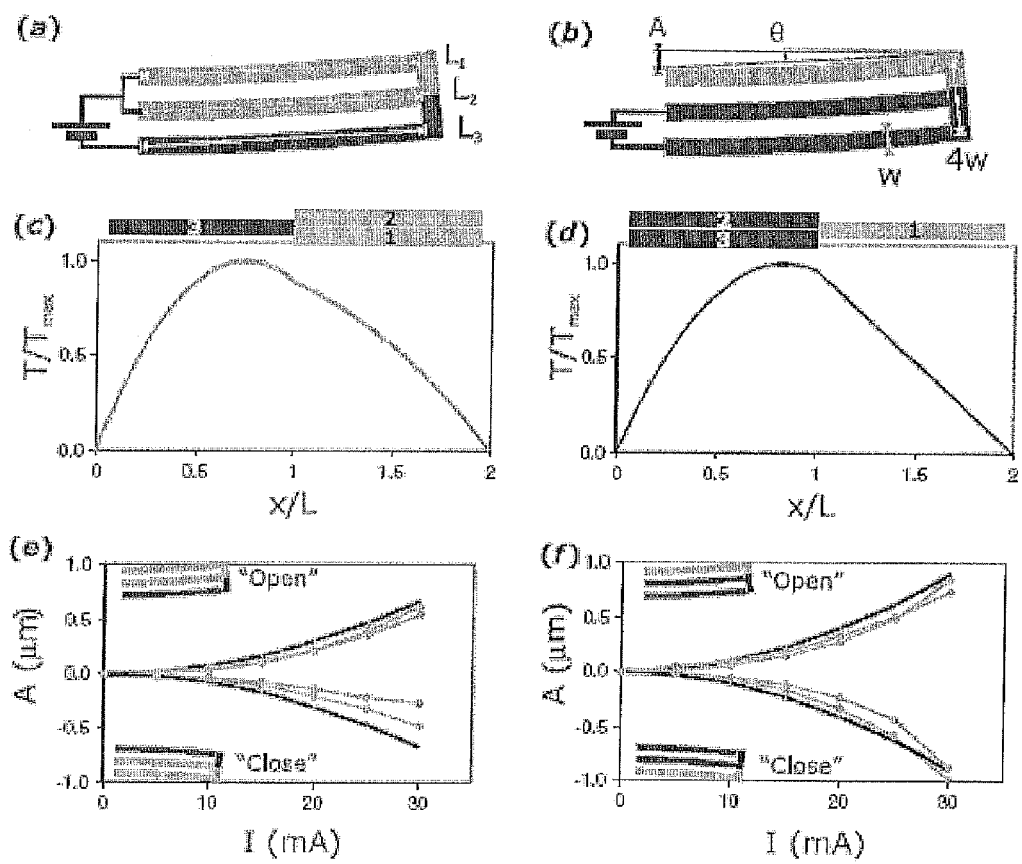
FIG. 16 illustrates actuation by resistive heating.
Figure 17:
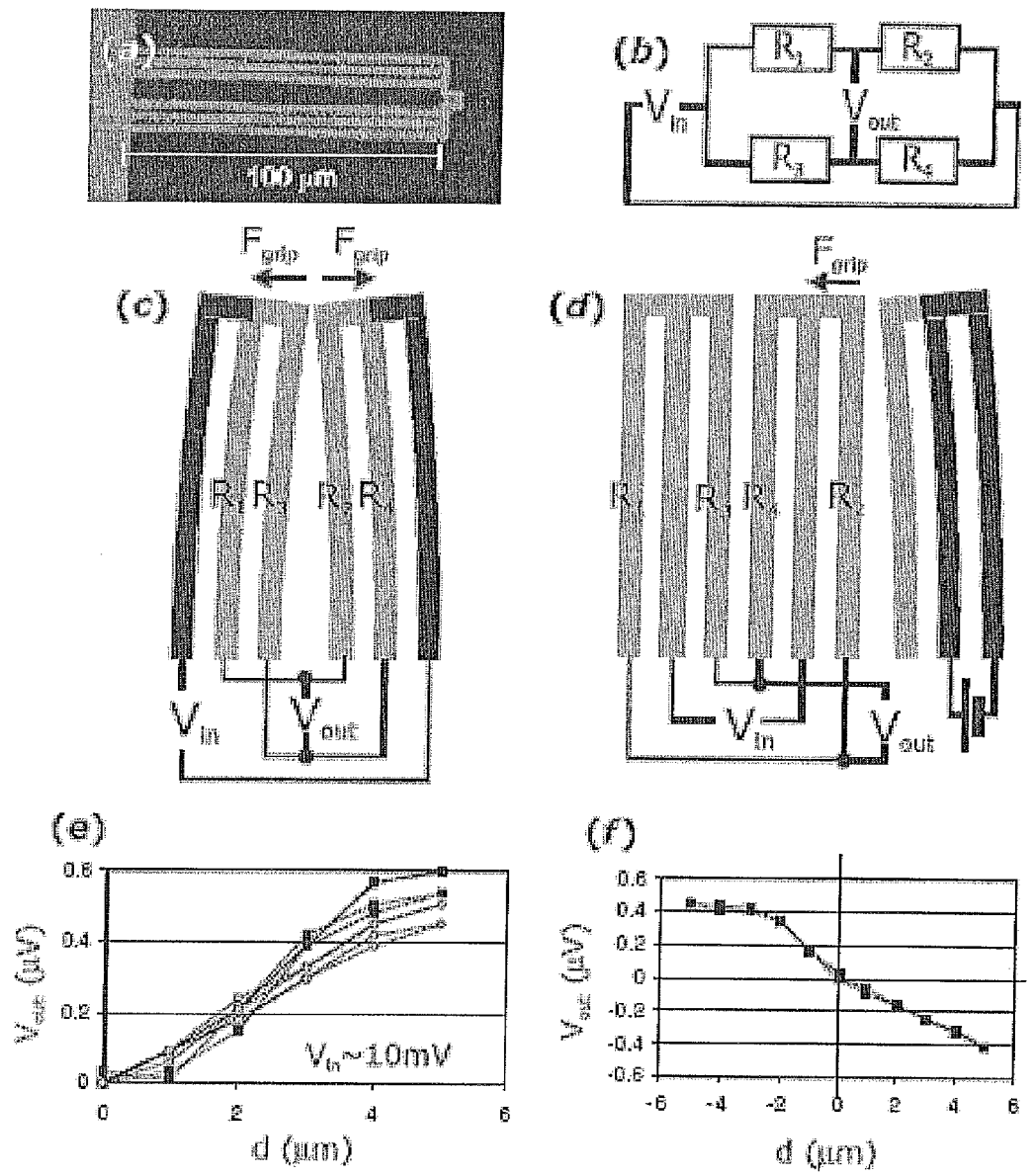
FIG. 17a is an optical image of the test device.
FIG. 17b illustrates a typical Wheatstone bridge resistor configuration.
FIG. 17c illustrates a gripper made with two actuators.
FIG. 17d illustrates a gripper configuration with three, three-beam structures.
FIG. 17e and FIG. 17f illustrate piezoresistive measurements on the setup in FIGS. 17c and 17d.

Referring now to FIG. 9 (reference numerals for similar parts of the invention will be same as for FIG. 2), for cases when the sample 206 is smaller than the gap between the arms 203, 204 another embodiment of the invention may be provided. In this at least two cross connectors 907 may be provided. These cross connectors 907 are connected mechanically and optionally electrically to the main connectors 201, 202 on the arms 203, 204. The sample 206 may then be positioned between two such cross connectors 907 and thus mechanically and/or electrically connected to the main connectors 201, 202.

The sample holder or TEM Chip as described in this document is arranged to be part of a measurement and testing system, for instance for use in a transmission electron microscope, comprising control electronics (described below in this document), a structure (not shown) for inserting parts of the system into the TEM, electrical connectors and wiring, and software for controlling signals and analysing received signals.

Control electronics is part of the overall measurement system for controlling and acquiring signals from the TEM chip. The control electronics may comprise a processing unit for processing and analysis of signals and for determining appropriate control signals, an interface unit for interfacing signals to and from the TEM chip (e.g. analogue to digital converters and digital to analogue converters), amplification and drive electronics, user interface unit or units, communication units, and storage units. Control electronics may also be applied for different types of drift and noise cancellation solutions that may be applied during TEM imaging and mechanical or electrical testing of samples. For instance a sample mounted on a TEM Chip according to the present invention provided with nano or micro positioning (see for example FIG. 3) may compensate for temperature drift by counter moving the sample using the nano or micro positioning while at the same time performing electrical measurements on the sample. It is even possible to apply mechanical drift compensation to the sample while performing mechanical testing since it is possible to apply a drift compensation signal overlayered on a signal performing mechanical testing.

The TEM chip may be adapted to fit into a TEM grid holder, e.g. holder for the generally available standard 3 mm diameter grids. It should be understood that even though the invention is adapted to fit in situ of standard TEM products (as from for example JEOL, FEI, Hitachi and so on), the invention may also be used in non standard TEM equipment as understood by the person skilled in the art.

It should be noted that the word "comprising" does not exclude the presence of other elements or steps than those listed and the words "a" or "an" preceding an element do not exclude the presence of a plurality of such elements. It should further be noted that any reference signs do not limit the scope of the claims, that the invention may be implemented at least in part by means of both hardware and software, and that several "means", "units" or "devices" may be represented by the same item of hardware.

The above mentioned and described embodiments are only given as examples and should not be limiting to the present invention. Other solutions, uses, objectives, and functions within the scope of the invention as claimed in the below described patent claims should be apparent for the person skilled in the art.

The invention claimed is:

1. A sample holder for nano or micro sized objects, said sample holder being arranged to be positioned in situ of a transmission electron microscope, wherein said sample holder comprises:
   a substrate structure with at least two arms protruding out from said substrate structure and positioned substantially in parallel with each other forming a gap between them; and
   a connector arranged to receive part of a sample on each arm,
   wherein said at least two arms are arranged to receive a sample forming a bridge between said two arms.

2. The sample holder according to claim 1, wherein said connector is an electrical connector enabling electrical testing on said sample.

3. The sample holder according to claim 1, wherein said connector is a mechanical connector enabling mechanical testing on said sample.

4. The sample holder according to claim 1, wherein said substrate structure is arranged to be mounted in a transmission electron microscope grid holder.

5. The sample holder according to claim 1, wherein said substrate structure is adapted to be mounted directly or indirectly to a piezoelectric driven inertial slider device.

6. The sample holder according to claim 1, wherein each arm is formed by three substantially parallel beams with a connection beam at a distal end away from said substrate structure and said beams is made of a resistive material through which an electrical current may pass, wherein said arm wilt bend depending on an applied current.

7. The sample holder according to claim 6, wherein said three beams are made of a piezo resistive material.

8. The sample holder according to claim 7, wherein said beams are electrically connected in a Wheatstone bridge arrangement.

9. The sample holder according to claim 6, wherein a gripping structure is located on said connection beam of each arm and located so as to be adjacent to a neighbouring gripping structure, said gripping structure protruding away from said substrate structure in a longitudinal direction of said beams.

10. The sample holder according to claim 9, wherein said gripping structure is arranged to be part of a tensile force testing.

11. The sample holder according to claim 9, wherein said gripping structure is arranged to enter a receiving structure of a sample.

12. A system for doing measurements and/or manipulation on nano or micro sized objects, comprising:

a sample holder, arranged to be used in situ of a transmission electron microscope, for mounting of said nano or micro sized object, said sample holder comprising a substrate structure with at least two arms protruding out from said substrate structure and said arms being positioned substantially in parallel with each other forming a gap between them; each arm comprise an electrical connector onto which said sample is to be mounted, wherein said sample is mounted on two of said electrical connectors and forming a bridge between said two connectors; and electronics for applying signals to said sample and measuring response effects from said sample.

13. The system according to claim 12, wherein said arms comprise three substantially parallel beams with a connection beam at a distal end away from said substrate structure and said beams are made of a resistive material through which an electrical current may pass, wherein said arm will deflect depending on applied current.

14. The system according to claim 13, wherein said three beams are made of a piezo resistive material.

15. The system according to claim 12, further comprising electronics for measuring and/or controlling forces applied to said beams.

16. The system according to claim 13, further comprising electronics for applying an oscillating signal to at least two beams of each arm and electronics for applying a lock-in analysis on signals obtained from said piezo resistive material.

17. The system according to claim 12, further comprising a nano or micro positioning device for positioning said sample holder spatially.

18. The system according to claim 12, further comprising electronics for controlling application of control signals to said beams to control a pick-and-place operation of nano or micro sized objects.

19. A microfabricated chip for investigating a material sample, said microfabricated chip comprising a substrate holding at least two cantilever structures adapted to perform mechanical and/or electrical measurements on said material sample held by said at least two cantilever structures, said at least two cantilever structures being positioned substantially in parallel with each other forming a gap between them.

20. The microfabricated chip according to claim 19, wherein said geometry of said substrate is adapted to fit a standard transmission electron microscope grid holder.

* * * * *